US008289818B2

(12) United States Patent
Taratorin et al.

(10) Patent No.: US 8,289,818 B2
(45) Date of Patent: Oct. 16, 2012

(54) MAGNETO-OPTIC WRITE-HEAD CHARACTERIZATION USING THE RECORDING MEDIUM AS A TRANSDUCER LAYER

(75) Inventors: Alexander M. Taratorin, Palo Alto, CA (US); Juergen Heidmann, Salinas, CA (US)

(73) Assignee: Infinitum Solutions, Inc., Santa Clara, CA (US)

( * ) Notice: Subject to any disclaimer, the term of this patent is extended or adjusted under 35 U.S.C. 154(b) by 0 days.

(21) Appl. No.: 13/298,039

(22) Filed: Nov. 16, 2011

(65) Prior Publication Data

US 2012/0092972 A1 Apr. 19, 2012

Related U.S. Application Data

(63) Continuation-in-part of application No. 12/649,145, filed on Dec. 29, 2009.

(60) Provisional application No. 61/414,614, filed on Nov. 17, 2010, provisional application No. 61/142,007, filed on Dec. 31, 2008.

(51) Int. Cl.
*G11B 11/00* (2006.01)

(52) U.S. Cl. .............. 369/13.13; 369/13.01; 369/13.32; 369/13.33; 360/59

(58) Field of Classification Search .................. None
See application file for complete search history.

(56) References Cited

U.S. PATENT DOCUMENTS

| 4,896,103 | A | 1/1990 | Shimanuki et al. |
| 5,212,446 | A | 5/1993 | Itoh et al. |
| 5,631,559 | A | 5/1997 | Oliver et al. |
| 5,663,652 | A | 9/1997 | Freeman |
| 5,835,257 | A | 11/1998 | Itoh et al. |
| 5,969,517 | A | 10/1999 | Rao |
| 6,084,396 | A | 7/2000 | Rao |
| 6,141,093 | A | 10/2000 | Argyle et al. |
| 6,934,068 | B2 | 8/2005 | Kochergin |
| 7,271,900 | B2 | 9/2007 | Decitre et al. |
| 2002/0027835 | A1* | 3/2002 | Takagi et al. ............... 369/13.06 |
| 2005/0002318 | A1* | 1/2005 | Murakami et al. ............ 369/130 |
| 2005/0163026 | A1* | 7/2005 | Oshima et al. .............. 369/275.2 |
| 2006/0022668 | A1* | 2/2006 | Yamamoto .................... 324/210 |
| 2007/0058494 | A1* | 3/2007 | Murakami et al. ......... 369/13.05 |

* cited by examiner

*Primary Examiner* — Joseph Haley
*Assistant Examiner* — Henok Heyi
(74) *Attorney, Agent, or Firm* — Silicon Valley Patent Group LLP

(57) ABSTRACT

A magneto-optical transducer including a magnetic layer on a transparent, non-magnetic substrate is used to characterize the performance of a write head based on optically detected magnetization in the magnetic layer. The write head sample is held in contact with or near the magnetic layer, which is illuminated through the substrate with linearly polarized light. Magnetization in the write head produces a magnetization in the magnetic layer, which alters the polarization state in reflected light. The reflected light is analyzed and the intensity detected using an optical detector, such as one or more photo-detectors or a camera. The performance of the write head can then be characterized using the detected intensity.

52 Claims, 18 Drawing Sheets

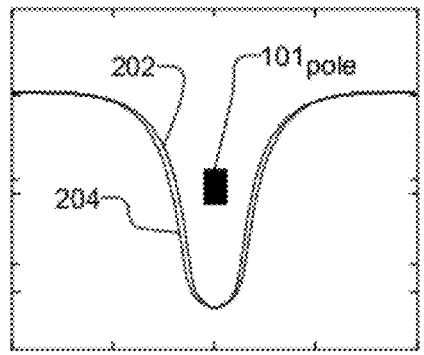
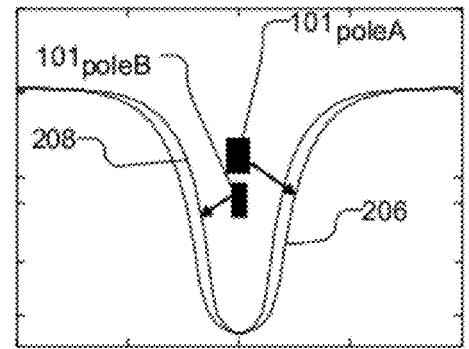
Fig. 11A          Fig. 11B
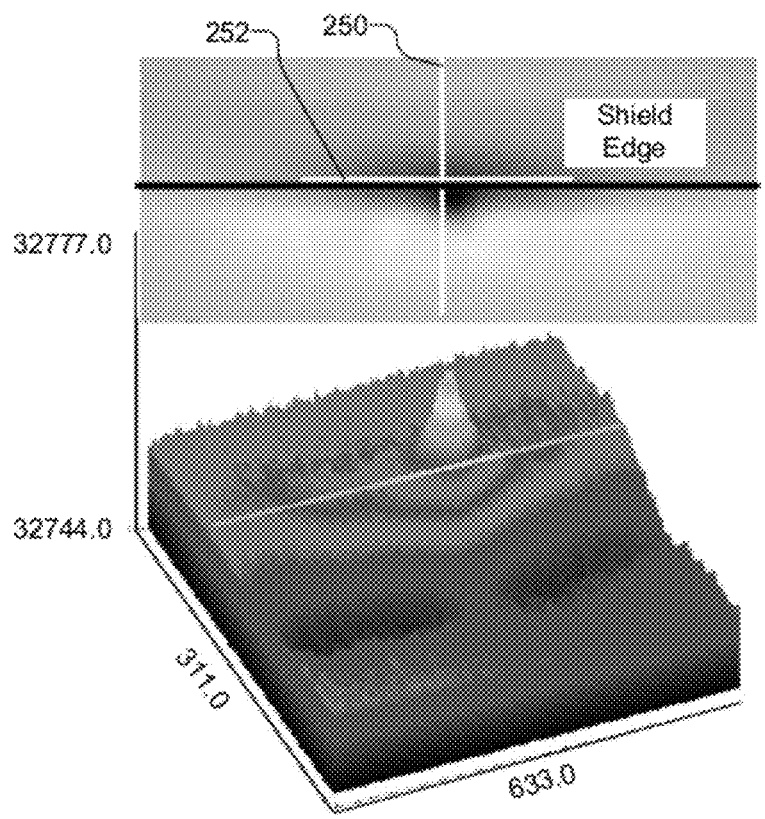
Fig. 12

MAGNETO-OPTIC WRITE-HEAD CHARACTERIZATION USING THE RECORDING MEDIUM AS A TRANSDUCER LAYER

CROSS REFERENCE TO RELATED APPLICATIONS

This application is a continuation-in-part of U.S. Ser. No. 12/649,145, filed Dec. 29, 2009, which claims the benefit of Provisional Application No. 61/142,007, filed Dec. 31, 2008, this application also claims the benefit of U.S. Provisional Application No. 61/414,614, filed Nov. 17, 2010, all of which are incorporated by reference herein in their entirety.

BACKGROUND

As technology advances, devices continue to shrink in size and it becomes increasingly difficult to test or verify the operation of the devices. One example of this is found in storage systems based on magnetic recording technology, which is commonly used in devices such as computers and digital electrical household appliances. In operation, a magnetic write head is used to magnetize bits of data on a recording medium, commonly referred to as a hard disk, while a read sensor is used to read the bits of data from the hard disk.

It is desirable to test devices, such as read sensors and write heads, early in the manufacturing process to increase yield and reduce costs. However, as devices, such as the read sensors and write heads, continue to shrink in size it is increasingly difficult to perform accurate measurements early in the manufacturing process. For example, a write head uses a write pole that has a size that is below the resolution of conventional optical imaging techniques. Accordingly, to image the write pole, typically a scanning electron microscope (SEM) is used. However, SEM is an expensive, time consuming test that is potentially destructive. Another method of testing a writer is with Magnetic Force Microscopy (MFM), where an MFM probe scans across the surface of the write pole while the writer is excited with a current. Alternatively, a spin-stand is sometimes used to test the write head. However, a spin-stand test is also an expensive and time-consuming test.

SUMMARY

A magneto-optical transducer including a magnetic layer on a transparent, non-magnetic substrate is used to characterize the performance of a write head based on optically detected magnetization in the magnetic layer. The write head sample is held in contact with or near the magnet layer structure, which is illuminated through the substrate with linearly polarized light. Magnetization in the write head produces a magnetization in the magnetic layer, which alters the polarization state in reflected light. The reflected light is analyzed and the intensity detected using an optical detector, such as one or more photo-detectors or a camera. The performance of the write head can then be characterized using the detected intensity.

In one embodiment, the performance of a write head is characterized using an optical metrology device including holding the write head in contact with a magnetic layer on a substrate that is transparent and non-magnetic; illuminating an area of the magnetic layer through the substrate with linearly polarized light, the area of the magnetic layer being under a write pole of the write head; producing magnetization in the write pole to alter the magnetization of the magnetic layer, the magnetization of the magnetic layer producing an altered polarization state in light reflected from the magnetic layer; analyzing the light reflected from the magnetic layer; detecting an intensity of the light reflected from the magnetic layer after being analyzed; using the intensity to characterize the performance of the write head; and storing the performance in memory.

In yet another embodiment, an apparatus for testing a write head sample includes a magneto-optical transducer comprising a magnetic layer on a substrate that is transparent and non-magnetic, the magnetic layer having a magnetization produced by magnetization of the write head sample when the write head sample is in contact or near the magnetic layer; a light source for producing light along an optical path; a polarizer on the optical path that produces polarized light; an optical system on the optical path that illuminates the magnetic layer with the polarized light through the substrate, wherein the magnetization of the magnetic layer produces an altered polarization state in reflected light from the magnetic layer; an analyzer on the optical path that converts the altered polarization state in the reflected light to an intensity; an optical detector on the optical path that detects the intensity of the reflected light; and a processor coupled to the optical detector to receive the intensity, the processor configured to determine a performance characteristic of the write head sample using the intensity and store the performance characteristic in memory.

BRIEF DESCRIPTION OF THE DRAWINGS

FIGS. 11A and 11B are graphs illustrating modeled calculations of the impact of the magnetic field variation and the width of the magnetic structure on the imaged magneto-optic contrast, respectively.

FIG. 12 shows an image of the magneto-optic contrast of a write head sample along with a 3-D rendering.

DETAILED DESCRIPTION

Figure 1A:
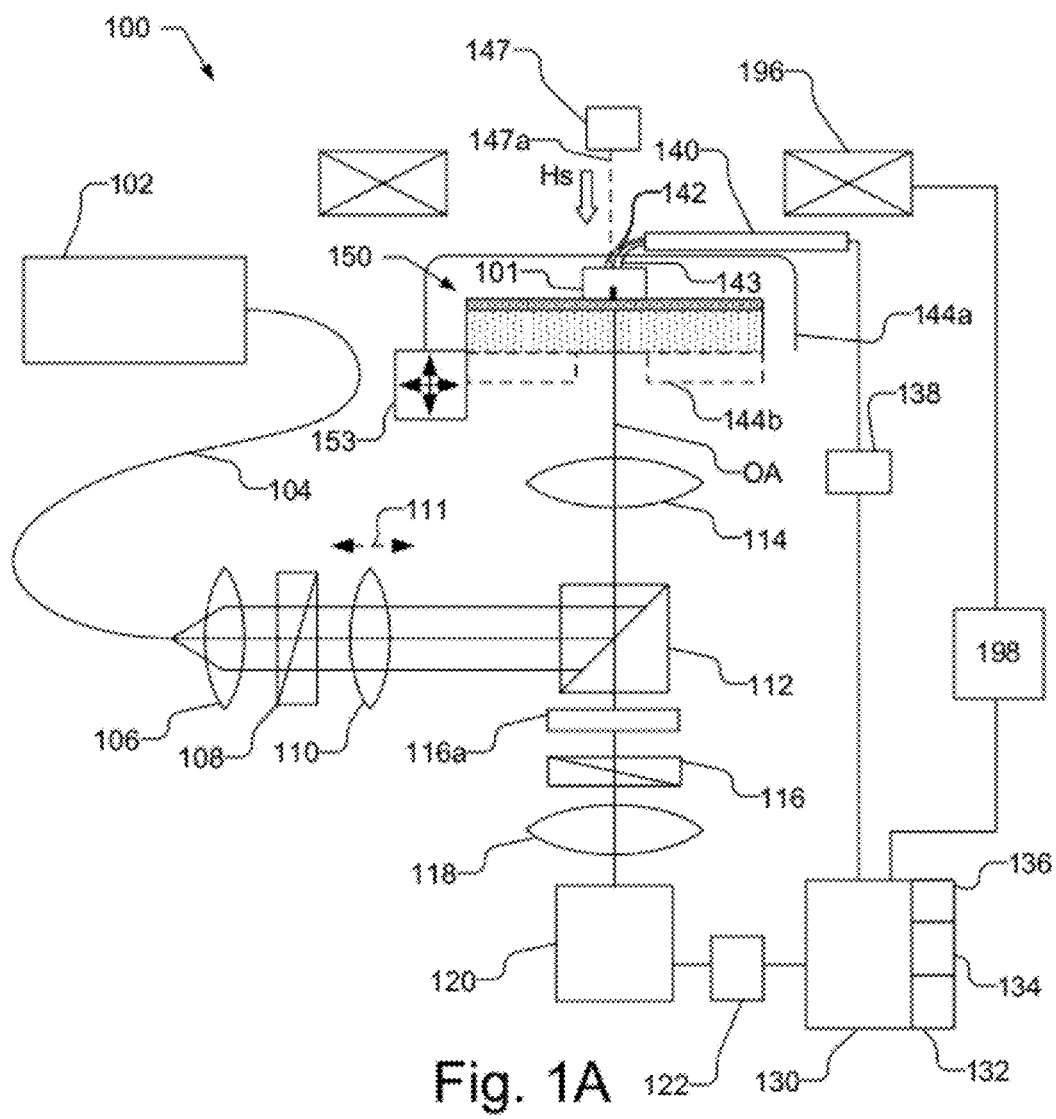
FIG. 1A illustrates a polarization microscope that uses a magneto-optical transducer to optically detect the effects of a magnetic field produced by a magnetic field producing structure that is below the optical resolution of the optics of the device.

FIG. 1A illustrates an optical imaging device 100 that uses a magneto-optical transducer 150 to optically detect the effects of a magnetic field produced by a magnetic field producing structure that is smaller than the optical resolution of the optics of the device 100. By way of example, device 100 may be used to optically detect the magnetic field produced by a write head or other similar small magnetic structures. A magneto-optical transducer 150 converts a magnetic field into an optical contrast utilizing the Faraday or Kerr effect. The device 100 may be a polarization microscope, such as a magneto-optic microscope system that uses the Faraday or Kerr effect, and may be, e.g., a white field microscope or a confocal microscope.

The device includes a light source 102, which may be a broadband light source, a light emitting diode (LED), or a laser, e.g., a 40 mW laser or 1.2 W with a wavelength of 630 nm or in the blue range, e.g., 400 nm to 475 nm, and more specifically 445 nm at 1.2 W. If desired, the wavelength of light used may be in the non-visible region of the spectrum, e.g., UV or DUV. The light from the light source 102 is provided to a collimator 106 either directly or by way of an intervening optical element, e.g., fiber optics 104 or a light pipe. The collimator 106 expands and collimates the light, which is polarized by polarizer 108 and focused by lens 110. In an embodiment in which the device is a confocal polarization microscope, the lens 110 (and/or other appropriate lens (es)) may be moved back and forth, as illustrated by arrow 111. Additionally, appropriate apertures may be used in an embodiment in which the polarization microscope is a confocal microscope. A beam splitter 112 reflects a portion of the light and the light is focused by an objective lens 114, e.g., at a normal angle of incidence. It should be understood, however, that an oblique angle of incidence may be used with an appropriate adjustment of the optics in device 100. The objective lens 114 focuses the light onto a magneto-optical transducer 150, which is illustrated in cross-sectional view in FIG. 1B. The magneto-optical transducer 150 includes a magnetic layer 152 such as a ferrimagnetic garnet film on a substrate 156 and may include a reflective layer 154 may be located between the sample 101 and the magnetic layer 152. The magneto-optical transducer 150 may further include a protective layer 158. If desired, the reflective layer 154 may be deposited on the magnetic layer 152 and is therefore part of the magneto-optical transducer 150 as illustrated in FIG. 1A, or alternatively, may be separate from the magnetic layer 152, e.g., applied to the bottom of the sample 101 or to a handling system and placed on the magnetic layer 152 when the sample 101 is loaded onto the device 100.

The light reflected from the magneto-optical transducer 150 passes back through the objective lens 114 and is transmitted through the beam splitter 112. A polarizer 116 analyzes the polarization state of the return light, which is focused by lens 118 onto an optical detector 120. By way of example, the polarizer 108 and the polarizer 116 are set to have an angle difference of ±16°. In one embodiment, a polarizing beam splitter 112 may be used in place of the polarizer 108 and polarizer 116. In addition to the polarizer 116, a quarter waveplate 116a may be positioned in front of the polarizer 116. The quarter waveplate 116a may be used to eliminate polarization ellipticity in the reflected light caused by the optical properties of the sample 101. Further, both the polarizer 116 116 and the quarter waveplate 116a are mounted on separate motorized, rotational stages (not shown). The rotational stages are controlled by a processor 130 that which sets the polarizer 116 and quarter waveplate 116a so that the ellipticity of the reflected light is minimized and the magneto-optic contrast is maximized.

When a laser is used as the light source 102, the coherence of the laser light has to be reduced or eliminated to avoid speckles and diffraction artifacts in the image. The coherence of the laser light can be reduced by one or more of the following; vibrating the optical fiber 104, modulating the laser at a frequency of e.g. 250 MHz or by inserting an optical diffuser in the illuminating light path. In a different approach, a multimode laser diode can be used to reduce light coherence with or without the previous measures implemented.

The optical detector 120 may be, e.g., a CCD or a CMOS based camera, or other appropriate imaging device. For example, a high resolution CMOS camera with 1920×1440 pixels and 12 bit A/D converter, such as produced by Hamamatsu Co may be used as the optical detector 120. In another embodiment, e.g., the optical detector 120 may be a non-imaging photodetector, such as a photodiode, which detects the optical intensity at a single spot. If desired, when a photodiode, or other non-imaging photodetector, is used as the optical detector 120, the device 100 may produce a two-dimensional image by scanning the illuminated area with respect to the sample 101, e.g., by providing relative movement between the optical system (i.e., the lenses 106, 110, 114, and 118; polarizer 108 and polarizer 116; beam splitter 112; and optical detector 120) and the sample 101, e.g., using actuator 153, or through appropriate optical manipulation of the incident beam, e.g., using scanning mirrors. Further, to improve signal to noise ratio (SNR) when using a non-imaging photo detector, a lock-in amplifier may be used to measure the out-put signal of the photo detector and by modulating the write current or alternatively by modulating the illuminating light of the polarization microscope. The use of a lock-in amplifier is also beneficial if the detector field-of-view is large, meaning the portion of the image that is changing is small compared to the overall image area to improve sensitivity and increase SNR. Moreover, a lock-in amplifier may be used for media-type testing, i.e., using a particular recording medium that is deposited over the magnetic layer 152 of the magneto-optical transducer 150 using, e.g., one or more heads, by modulating the write current or alternatively by modulating the illuminating light of the polarization microscope. In the case of an HAMR type recording head, instead of modulating the write current the heating source, e.g. a laser, can be modulated.

The optical detector 120 is connected to a processor 130 via an optional frame grabber 122 and the processor 130 receives, stores, and analyzes the optically detected data provided by the optical detector 120. The processor 130 includes a computer-usable medium 132 having computer-readable program code embodied therein for causing the processor 130 to control the device and to perform a desired analysis, as described herein. If desired, multiple separate processing units may be used to perform discrete tasks, which may be coupled together or may be separated. The data structures and software code for automatically implementing one or more acts described in this detailed description can be implemented by one of ordinary skill in the art in light of the present disclosure and stored on a computer readable storage medium, which may be any device or medium that can store code and/or data for use by a computer system such as processor 130. This includes, but is not limited to, magnetic and optical storage devices such as disk drives, magnetic tape, compact discs, and DVDs (digital versatile discs or digital video discs). The processor 130 includes storage/memory 134 and a display 136 for storing and/or displaying the results of the analysis of the data. The display 136 may be, e.g., a printer or monitor.

The device 100 is configured to measure desired characteristics of a sample 101 when the sample 101 or the magnetic field producing structure of the sample 101 are below the optical resolution of the optics in the device 100. For example, the sample 101 may be a hard disk drive (HDD) write head in the form of a bar, slider, HGA (head gimbal assembly), and HSA (head stack assembly), a Heat Assisted Magnetic Recording (HAMR) write head, or a tape write head or other localized field electromagnet, and the magnetic field producing structure is a write pole in the write head. For a write head sample 101 or other electromagnetic sample 101, the device 100 includes a probe card 140 that is configured to be coupled to the sample 101 to provide a current, which will induce the sample 101 to produce the magnetic field. The probe card 140 may be connected to the sample 101 using one or more probes 142, which may be, e.g., pogopins, probes, or other contacts such as wires that are wire bonded. The probe card 140 is coupled to current or voltage source 138, which is connected to and controlled by processor 130.

When the sample 101 is a write head that includes a Dynamic-Flying Height (DFH) device, one of the probes 142 of the probe card 140 may be used to provide current to the DFH device on a write head sample 101. The source of the current may be a second circuit in the current or voltage source 138. Write heads use a DFH device as an adjustment mechanism to internally bias the write pole closer to or further from air bearing surface. The DFH device is typically in the form of a heater incorporated into the write head structure, with additional contact pads for external connection. By applying a bias to the additional contact pads via the probe card 140, the position of the write pole can be adjusted towards or away from the air bearing surface of the write head. By adjusting the position of the write pole via the DFH device, the sample 101 may be measured at different temperatures and/or vertical displacement from the magneto-optical transducer 150.

Additionally, when the sample 101 is a write head that includes a microactuator device, one of the probes 142 of the probe card 140 may be used to provide current to the microactuator device on a write head sample 101. The source of the current may be a second circuit in the current or voltage source 138. Write heads use a microactuator device as an adjustment mechanism to move the write pole in the cross-track direction to better align the write pole to the lands of a disk that is being written to. The microactuator device is incorporated into the write head structure, which includes additional contact pads for external connection. By applying a bias to the additional contact pads via the probe card 140, the position of the write pole can be adjusted in the cross-track direction. By adjusting the position of the write pole via the microactuator device during measurement with the device, the performance of the microactuator may be verified and the characteristics of the sample 101 may be measured at different write pole positions.

Additionally, when the sample 101 is a HAMR write head that includes a thermal device, such as a high intensity light source, a connector element 143 may be used to connect to and operate the thermal source of the HAMR write head sample 101. It should be understood that the connector element 143 may be a probe in the probe card 140. Alternatively, if the thermal source is external to the HAMR write head sample 101, e.g., laser 147, then the light from laser 147 is provided to the HAMR write head sample 101 as illustrated by light path 147a.

The device 100 may also include a temperature control element that is thermally coupled to the sample and used to heat and/or cool the sample 101 during measurement and is coupled to and controlled by the processor 130. The temperature control element may be, e.g., a temperature control chamber 144a into which the sample 101 is positioned. The temperature control element may be a temperature plate 144b that is in contact with the sample 101, e.g., through the magneto-optical transducer 150. The temperature plate 144b may include an aperture through which the objective lens 114 is permitted to focus on the magneto-optical transducer 150, as illustrated in FIG. 1A.

The device 100 may also include an external magnetic field source 196 as shown in FIG. 1A. The magnetic field source 196 is controlled by a field controller 198, which may be coupled to and controlled by the processor 130. The controller 198 may be, e.g., a current or voltage source and may control the field source 196 to turn the magnetic field on or off or to vary the magnitude and polarity of the magnetic field or to provide a pulsed write current, as used by a typical write driver in HDD applications. The external magnetic field source 196 may be used to produce a magnetic field in the shield of a write head sample. The field produced by the shield can then be viewed using the magneto-optical transducer 150 to confirm the location of the write head sample 101 within the field of view of the optics of the device 100. Confirming the location of the sample is advantageous as it confirms that the sample is in the field of view or can be used to reposition the sample such that it will be within the viewing area. Moreover, by knowing the location of the sample within the field of view, the image area that is processed can be reduced thereby speeding up the testing. Additionally, the field produced by the shield may be imaged with the magneto-optical transducer 150 and used to aid in loading the sample 101 so that there is good optical contact between the sample 101 and the magneto-optical transducer 150. Further, the field produced by the shield may be imaged with the magneto-optical transducer 150 and used to aid in focusing the device 100.

The focus of the device 100 may be automatically or manually adjusted using actuator 153 to maximize the contrast produced by the magnetic field from the shield of the write head in the magneto-optical transducer 150. If desired, actuator 153 may be used only for focusing/height adjustment and not lateral movement of the magneto-optical transducer 150. Alternatively, the optics may be moved with respect to the magneto-optical transducer 150. In one embodiment, a coarse focus is performed using the field produced by the shield from the external magnetic field source 196, followed by fine focus using the magnetic field produced by the write pole from the sample 101 to find the focal position that produces the maximum magneto-optical peak contrast. In one embodiment, focusing of the device may be performed by projecting a diaphragm or small structure on the magneto-optical transducer 150 and automatically or manually adjusting the focus to produce the sharpest image of the diaphragm or small structure. It should be understood that when using actuator 153 to move the magneto-optical transducer 150, the sample 101 and probecard 140/142 may be moved as well so that the sample 101 remains stationary with respect to the magneto-optical transducer 150 as it is being moved towards or away (or laterally) with respect to the optics, particularly during a fine focus adjustment using the magnetic field produced by the write pole. Alternatively, the probecard 140/142 may have enough compliance that it need not be moved during the fine focusing procedure or the probecard 140/142 may be removed and recoupled to the sample 101 before and after the fine focusing procedure.

The external magnetic field source 196 may be used to apply an external biasing field to partially or completely saturate the magneto-optical transducer or the sample 101. Field biasing may be used to increase the contrast when the sample produces a field in the opposite polarity of the external field, which produces a biased background in the magneto-optical transducer 150. Additionally, non-pole portions of the sample head that produce stray fields may be saturated with the external field, reducing the effects on the magneto-optical transducer 150 from non-pole structures so that the magneto-optic contrast of the pole structure is further enhanced. Additionally, the external magnetic field source 196 may be used to produce an AC or DC field to erase a magnetic layer that may be applied on the garnet, as described below. For example, the sample 101 may write a bit to a magnetic layer on the magneto-optical transducer 150, which can then be imaged. After testing and in preparation for the next sample to be tested, the written bit is erased using the external magnetic field source 196. If external magnetic field source 196 AC erases the magnetic layer on the magneto-optical transducer 150, then a bit written to the magnetic layer will have only half the contrast vs. the average background. However, if the external magnetic field source 196 applies a DC bias, as discussed above, then a bit written with a polarity in opposite direction to the DC bias will have a maximum contrast. It should be understood that the external magnetic field source 196 may be composed of several magnets. For example, the field required to magnetize the shields may only be 100 Oe, but to erase the magnet layer a field of 6K Oe may be needed. The external magnetic field source 196 may be a controllable magnetic field source by using electromagnets or permanent magnets that may or may not be mounted to a separate stage assembly to accommodate the desired range in fields or a combination thereof.

Figure 1B:
FIG. 1B illustrates a cross-sectional view of a magneto-optical transducer.
Figure 2A:
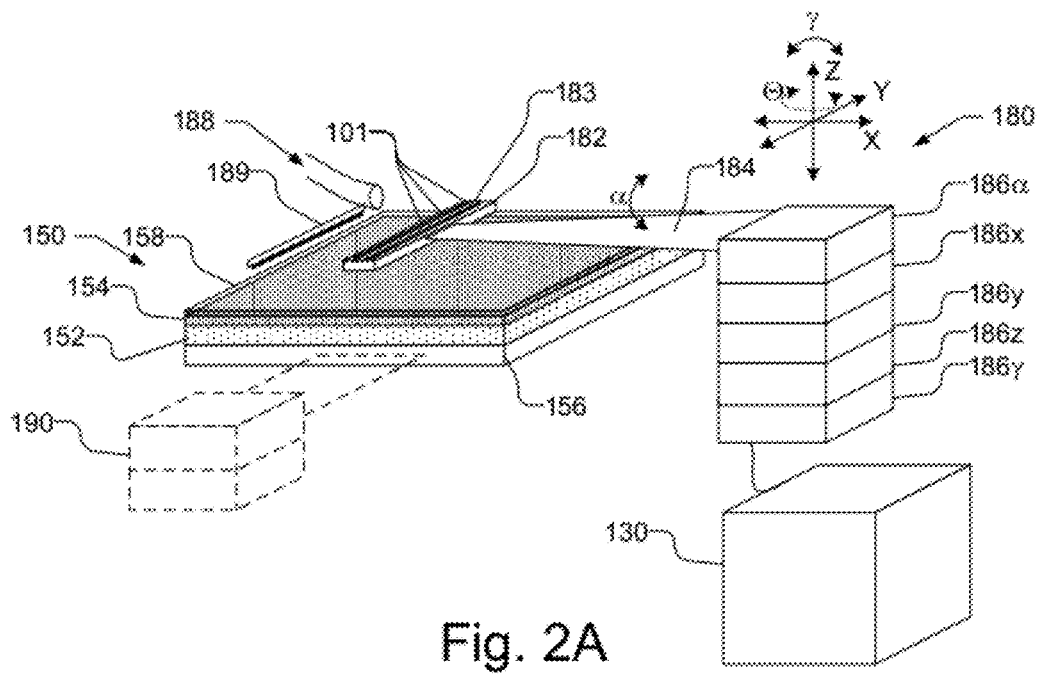
FIGS. 2A and 2B illustrate a perspective view of the magneto-optical transducer and a loader holding samples in bar form and slider form, respectively, and that may be part of the device of FIG. 1A.

FIG. 2A illustrates a perspective view of a magneto-optical transducer 150 and a loader 180 that may be part of the device 100. The magneto-optical transducer 150 includes a magnetic layer 152, such as a ferrimagnetic garnet film with in-plane anisotropy. A suitable garnet film for the magnetic layer 152 may be polycrystalline or monocrystalline and deposited over a non-magnetic garnet substrate 156 that is optically transparent at the wavelength or wavelengths used by the light source 102. By way of example, the substrate 156 may be a Gallium-Gadolinium-garnet that is, e.g., 0.5 mm to 1 mm thick. If desired, an anti-reflection layer (not shown), which may be optimized for the wavelength of the illuminating light (e.g., 630 nm) may be deposited on the bottom of the garnet substrate 156, i.e., facing the light source. The garnet film 152 may be deposited on the substrate 156, e.g., by liquid phase epitaxi, and may be formed with various compositions and thickness ranges. By way of example, one suitable film is a monocrystalline garnet film 152 having a composition of $(Bi,Y,Pr)_{3.0}(Fe,Ga)_{5.0}O_{12.0}$, and a thickness range of between 0.3 µm and 5 µm, and in one embodiment is 3 µm thick and has a saturation field of approximately 740 Oe. However, other compositions and thickness ranges and saturations fields may be used. For the sake of simplicity, the magnetic layer 152 may sometimes be referred to as a garnet film 152, but it should be understood that the magnetic layer 152 is not limited to garnet. For example, the magnetic layer 152 may be formed from magnetic films such as NiFe, Ni, NiCr, CoFe, NiFeCr, or CoNiFe alloys or single crystals made from these elements if desired. It should be understood that magnetic films of Ni, NiCr, NiFe, CoFe, NiFeCr or CoNiFe are reflective and thus, the Kerr effect is employed by the device.

Where a garnet film 152 is used and is transparent to the light from the light source 102, a reflective layer 154 is used to reflect light back through the garnet film towards the optical detector 120. The reflective layer 154 is effectively part of the magneto-optical transducer 150 as it reflects the light back through the magnetic layer 152, but the reflective layer 154 need not overlie the magnetic film 152. Thus, while in one embodiment, as illustrated in FIGS. 1B and 2A, the reflective layer 154 is illustrated as being deposited on and overlying the magnetic layer 152, if desired, the reflective layer may be separable from the magnetic layer 152, e.g., the reflective layer 154 may be applied to the bottom of the sample 101 or onto to a handling system and placed on the magnetic layer 152 when the sample 101 is loaded onto the device 100. The reflective layer 154 may be formed from a layer of, e.g., gold, silver, or aluminum and may be, e.g., 20 nm to 50 nm. In one embodiment, a protective layer 158 may be deposited over the reflective layer 154, i.e., between the reflective layer 154 and the sample 101. The protective layer 158 may be formed from $SiO_2$, $TiO_2$, $Al_2O_3$, or $CrO_2$, or diamond-like carbon (DLC) and may be 1 nm-40 nm thick. It should be understood that magnetic films of Ni, NiCr, NiFe, CoFe, NiFeCr or CoNiFe are reflective and thus, the reflective layer 154 may not be necessary if the magnetic layer is thick enough to adequately reflect the light from the light source 102. Moreover, it has been found that the garnet magnetic layer 152 may be sufficiently reflective and has good wear attributes that the reflective layer 154 and protective layer 158 need not be included, which is advantageous as without the reflective layer 154 and protective layer 158, the sample 101 is approximately 40 nm closer to the garnet magnetic layer 152.

Figure 2B:
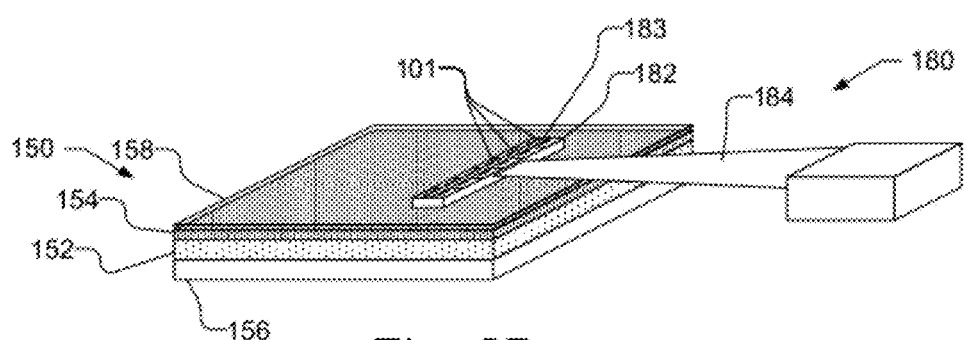

FIG. 2A also illustrates one embodiment of a loader 180 that holds one or more samples 101 and positions the samples 101 with respect to the magneto-optical transducer 150. FIG. 2A illustrates the samples 101 in bar form. FIG. 2B is similar to FIG. 2A, but shows the samples in individual form. As illustrated in FIG. 2A, the loader 180 may include a mount 182 for holding the samples 101 and an arm 184. The arm 184 may be compliant to hold the sample 101 against the magneto-optical transducer 150 with an appropriate force, as well as to hold the sample 101 in place if the magneto-optical transducer 150 is moved in the Z axis during focusing without moving the loader 180. The loader 180 may also include one or more actuators, such as actuators 186x, 186y, and 186z that move the samples 101 in the X, Y, and Z directions. The loader 180 may include additional actuators 186α and 186γ that may be used to respectively tilt or pitch the samples 101 with respect to the magneto-optical transducer 150. If desired, the loader 180 may also or alternatively move the samples 101 in θ direction. The loader 180 is connected to and controlled by processor 130. The loader 180 positions the one or more samples 101 on or close enough to the magneto-optical transducer 150 that the magnetization of the magnetic layer 152 is effected by the magnetic field produced by the samples 101. Further, the loader 180 is configured to hold the samples 101 flat with respect to the magnetic layer 152 in the magneto-optical transducer, e.g., by holding the samples 101 flat against the reflective layer 154 or the protective layer 158 over the reflective layer 154 if used. By way of example, as illustrated in FIG. 2A, a clamp 183 may be used to hold a plurality of samples 101 in slider form in the mount 182, which holds the samples 101 against the magneto-optical transducer 150. In one embodiment, inclination of the samples 101 may be tilted and pitched, as illustrated by arrow α and arrow γ, so that the magnetic field producing structure on the sample 101, e.g., a write pole, is held close to and/or flat against the magneto-optical transducer 150. The amount of tilt α and pitch γ used with a sample 101 may be determined during the focusing procedure, e.g., with the magnetic field produced by the external magnetic source 196 generating a field in the shield of a write head sample. The tilt α and pitch γ may be adjusted to maximize the contrast produced by the magnetic field from the shield of the write head in the magneto-optical transducer 150 as well as for magneto-optic contrast maximization discussed above.

Figure 2C:
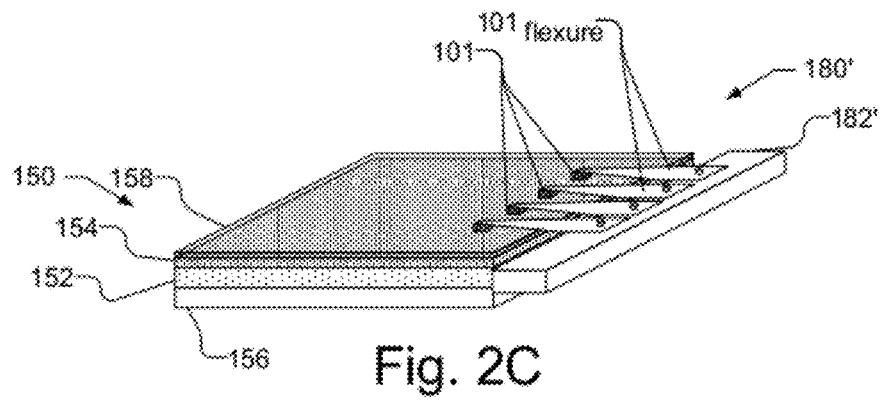
FIG. 2C illustrates another embodiment of a loader that holds one or more samples in head gimbal assembly form.

It should be understood that the samples 101 may come in forms other than bar and individual sliders, as illustrated in FIGS. 2A and 2B, such as in head gimbal assembly or head stack assembly form. FIG. 2C illustrates an embodiment of a loader 180' that holds one or more samples 101 in head gimbal assembly form. As illustrated in FIG. 2C, samples 101 are attached to flexures $101_{flexure}$, which are held by a mount 182'. The positioning of the mount 182' and the flexures $101_{flexure}$ bias the samples 101 to be held flat against the magneto-optical transducer 150. Samples 101 in a head gimbal stack form may be held in a similar manner, where the flexures bias the sample 101 to be held flat against the magneto-optical transducer 150. The loader 180' may have all the position and spring compliance capabilities of loader 180 and be controlled by processor 130 as described above.

Figure 2D:
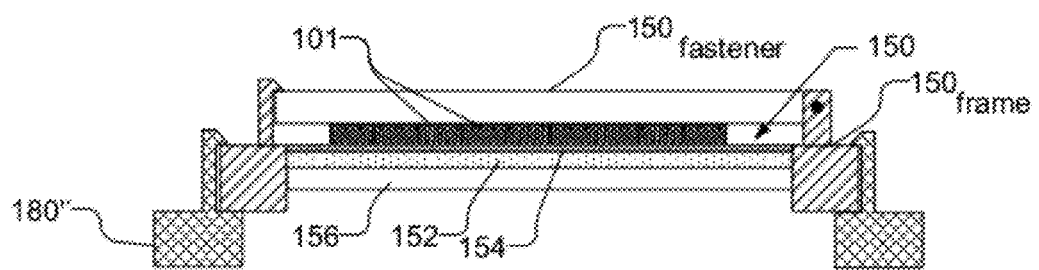
FIG. 2D illustrates a cross-sectional view of an embodiment of a loader that holds the magneto-optical transducer with samples in bar form held to the magneto-optical transducer with a mechanical fastener.

FIG. 2D illustrates a cross-sectional view of an embodiment of a loader 180" that holds the magneto-optical transducer 150 with samples 101 when the samples 101 are in bar form. It should be understood, however, that loader 180" could be used with samples 101 in slider, HGA or other form. The magneto-optical transducer 150 includes a frame $150_{frame}$ that supports the substrate 156 along with the magnetic layer 152 and the reflective layer 154 if it is part of the magneto-optical transducer 150. A fastener is used to hold samples 101 in bar form flat against the magneto-optical transducer 150. For example, in FIG. 2D, a clamp $150_{fastener}$ that is attached to the frame $150_{frame}$ is used to hold the samples 101 in bar form. A loader 180" is used to hold the magneto-optical transducer 150 within the field of view of the objective lens 114 (FIG. 1) while the samples 101 are held on the magneto-optical transducer 150. The loader 180" may be, e.g., a clamp or other mechanical fastening device to hold the magneto-optical transducer 150. In use, the samples 101 in bar form may be mounted to the magneto-optical transducer 150, e.g., by fastener $150_{fastener}$, before the magneto-optical transducer 150 is mounted to the loader 180". After measurement of the samples 101, the magneto-optical transducer 150 with the attached samples 101 is removed from loader 180" and a different or the same magneto-optical transducer 150 with new samples 101 attached may again be mounted to the device 100. In one embodiment, many magneto-optical transducers 150 may be used and the samples 101 pre-mounted to the magneto-optical transducers 150 so as to increase throughput. In another embodiment, the clamp $150_{fastener}$ may be part of the loader 180", in which case the samples 101 cannot be pre-loaded on to the magneto-optical transducer 150. The loader 180" may be positioned using actuators 186 as described above. The loader 180" may include variation in the pitch and tilt as part, e.g., of the fastener $150_{fastener}$.

Figure 2E:
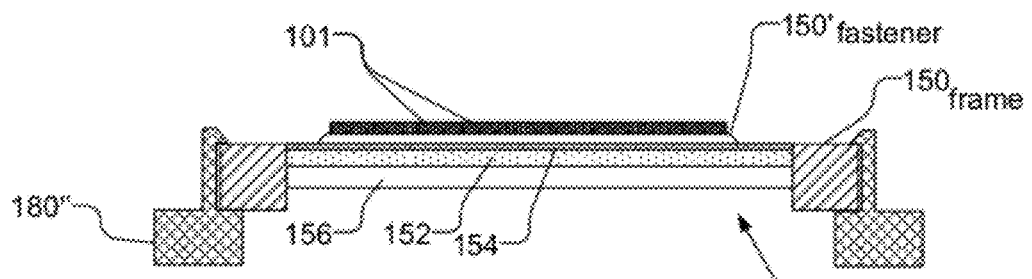
FIG. 2E is similar to FIG. 2D, but illustrates the samples in bar form held to the magneto-optical transducer with an adhesive fastener.

FIG. 2E illustrates a cross-sectional view a loader 180" similar to that shown in FIG. 2D, but where a mechanical faster is not used to hold the samples 101 to the magneto-optical transducer 150. As illustrated in FIG. 2E, the fastener $150'_{fastener}$ is an adhesive fastener that adheres the samples 101 in bar form to the magneto-optical transducer 150. The fastener $150'_{fastener}$ may be a soluble adhesive or thermoplastic that can be removed to separate the samples 101 from the magneto-optical transducer 150 and permitting use of the magneto-optical transducer 150 to be used with subsequent samples 101.

Over time and with multiple contacts with samples under test, the magneto-optical transducer 150 may become contaminated at the location of contact with the samples. Accordingly, as illustrated in FIG. 2A, the device 100 may include a cleaner 188 that is used to clean the magneto-optical transducer 150 to assure proper contact between the samples 101 and the magneto-optical transducer 150. For example, the cleaner 188 may include air, gas or liquid wash supply that applies the air gas or liquid wash to the top surface of the magneto-optical transducer 150. The cleaner 188 may also include a wiper 189 to physically wipe the surface of the magneto-optical transducer 150.

Additionally, in one embodiment, one or more actuators may be used to provide a relative change in position of the magneto-optical transducer 150 with respect to the magneto-optical imaging area and the location of where the samples 101 are loaded. By way of example, actuators 190 may be coupled to the magneto-optical transducer 150 and may move the magneto-optical transducer 150 after a set number of contacts with samples 101, e.g., after a 1000 contacts, to load the samples 101 at an uncontaminated portion of the magneto-optical transducer 150. Alternatively, the magneto-optical transducer 150 may move after every measurement and, if desired, periodically return to load locations a number of times. If the magneto-optical field of view is large enough, the actuators 186x and 186y may be used to move the samples 101 to uncontaminated areas of the magneto-optical transducer 150 without requiring the use of actuators 190.

Further, the magneto-optical transducer 150 may be a replaceable component that is removably attached to the device 100, e.g., as illustrated in FIGS. 2D and 2E. After a number of uses or after the condition of the magneto-optical transducer 150 is degraded, the magneto-optical transducer 150 may be replaced with a different magneto-optical transducer 150.

Figure 3A:
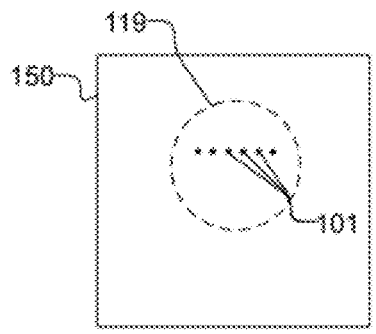
FIG. 3A illustrates a plan view of the magneto-optical transducer and illustrates the field of view of the objective lens.

FIG. 3A illustrates a plan view of the magneto-optical transducer 150 and illustrates the field of view 119 of the objective lens 118. The objective lens 118 may be 50× to 100× magnification with an NA of approximately 0.75 and produce a field of view of approximately 124 μm-250 μm. A plurality of samples 101 are illustrated by solid dots. As can be seen, a number of samples 101 may fit within the field of view 119, but it should be understood that the magneto-optical transducer 150 is positioned between the samples 101 and the objective lens 118, and thus, while the samples 101 are within the area of the field of view 119, the samples 101 are hidden from the objective lens 118 by the magneto-optical transducer 150. With a large field of view 119, a plurality of samples 101 may be optically detected via the magneto-optical transducer 150 simultaneously without requiring a relative movement between samples 101 and the objective lens 118 of the device 100. Additionally, a large field of view 119 with respect to the size of the samples 101 reduces the positioning constraints of the loader 180 (and loaders 180' and 180").

The device 100 is configured to measure desired characteristics of a sample 101 when the projection of the magnetic field producing structure of the sample 101 is dimensioned below, i.e., is smaller than, the optical resolution limit of the optics in the device 100, i.e., the optics of the device 100 could not image the sample 101. Theoretically, the optical resolution limit of the optics of the device 100 is defined by the Rayleigh Criterion as:

$$d = \frac{1.22\lambda}{2n\sin\alpha} \qquad \text{Equation 1}$$

where $\lambda$ is the wavelength of the incident light, n is the numerical aperture of the objective lens and $\alpha$ is the angle of incidence. By way of example, at normal incidence with a wavelength of 640 nm and an objective numerical aperture of 0.75, the optical resolution is 520 nm. In practice, however, the actual optical resolution limit, i.e., the smallest dimension that is optically resolvable by the device, is typically much worse than suggested by the theoretical limit by 20% or more due to factors such as spherical aberration of the objective lens and the illumination aperture.

Figure 3B:
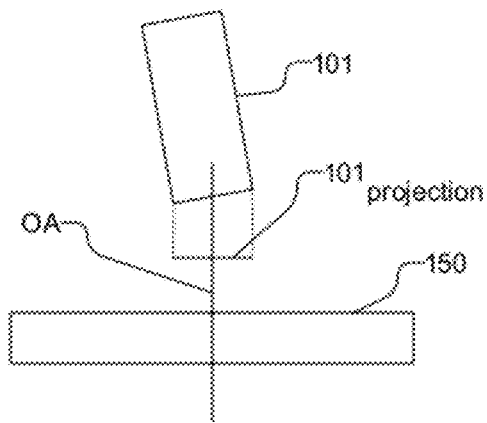
FIG. 3B illustrates a projection of the magnetic field producing structure of the sample with respect to the optical axis.

FIG. 3B illustrates a projection of the magnetic field producing structure of the sample 101 with respect to the optical axis OA. The projection 101$_{projection}$ is the projection of the sample 101 on a plane perpendicular to the optical axis OA of the device 100. The sample 101 in this case may be a write pole that has a tip of approximately 100 nm. Generally, the sample 101 will be held parallel to the magneto-optical transducer 150, and thus, approximately perpendicular to the optical axis OA, and thus, the projection 101$_{projection}$ is approximately 100 nm. Typically, to resolve the tip of a write pole to form an image, a scanning electron microscope must be used as conventional imaging techniques are inadequate. The device 100 is configured to optically detect the effects of the magnetic field produced by a sub-resolution projection of a magnetic field producing structure by controlling the distance of the sample 101 from the magnetic layer 152 of the magneto-optical transducer 150 and by using a magnetic layer 152 in the magneto-optical transducer 150 with a saturation field that is configured so that the magnetic field produced by the sample 101 results in a response in the transducer that is resolvable by the optics of the device 100.

Figure 3C:
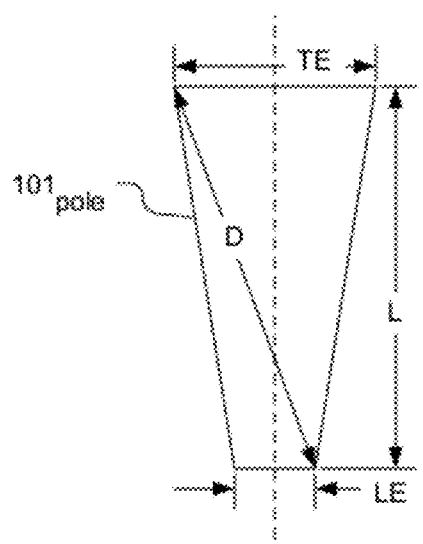
FIG. 3C illustrates a projection of the magnetic field producing structure when the magnetic field producing structure is a write pole.

FIG. 3C illustrates a projection of the magnetic field producing structure when the magnetic field producing structure is a write pole 101$_{pole}$. As illustrated in FIG. 3C, the projection of the write pole 101$_{pole}$ has the same dimension (e.g., when the write pole 101$_{pole}$ is normal to the plane that is perpendicular to the optical axis OA of the device 100) or smaller dimension (e.g., when the write pole 101$_{pole}$ is at an angle with respect to the plane that is perpendicular to the optical axis OA of the device 100) and the same shape as the tip of the write pole 101$_{pole}$ which may have a trapezoidal shape, with a Trailing Edge (TE) that is e.g., 100 nm wide in the cross-track direction, a length L that is 250 nm in the down-track direction, and a Leading Edge (LE) that may be as short as 0 nm, i.e., the write pole 101$_{pole}$ tip is triangularly shaped, but typically may be approximately half of the trailing edge (TE), e.g., 50 nm. In the case of a 50 nm LE, as illustrated in FIG. 3C, the diagonal line (D) will be about 261 nm, making this the longest linear dimension of this sample. The shape that is imprinted on magnetic layer 152 or in a magnetic recording layer 162, described below in reference to FIGS. 4C and 4D, will be similar to the shape of the tip of the write pole 101$_{pole}$.

Figure 3D:
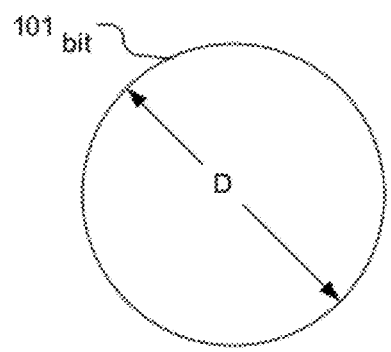
FIG. 3D illustrates a projection of magnetic field producing structure when the magnetic field producing structure is a bit imprinted by a HAMR write head with the heating element enabled on a magnetic recording layer that overlies the magnetic layer of the magneto-optical transducer.
Figure 4A:
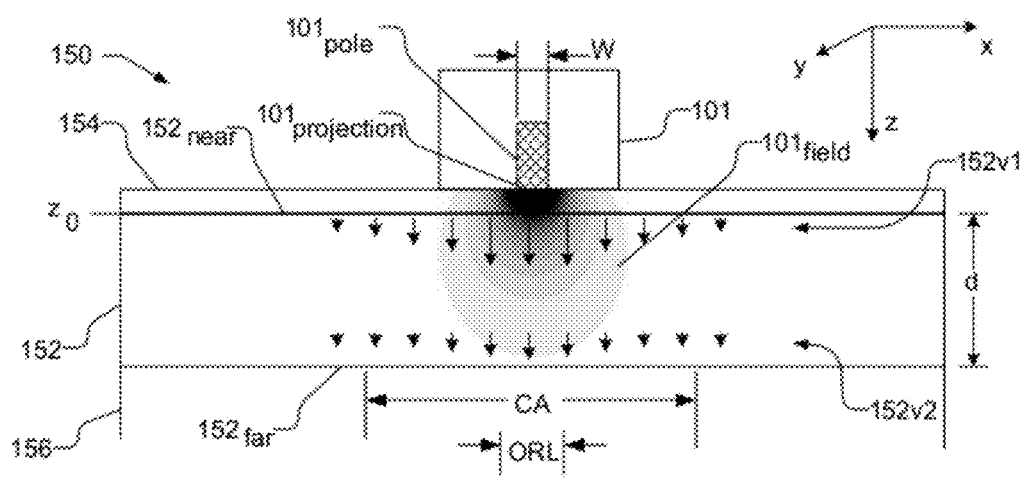
FIG. 4A illustrates a cross-sectional view of a magneto-optical transducer, including a ferrimagnetic garnet film and a reflective layer, along with a sample in the form of a write head, including a write pole.
Figure 4B:
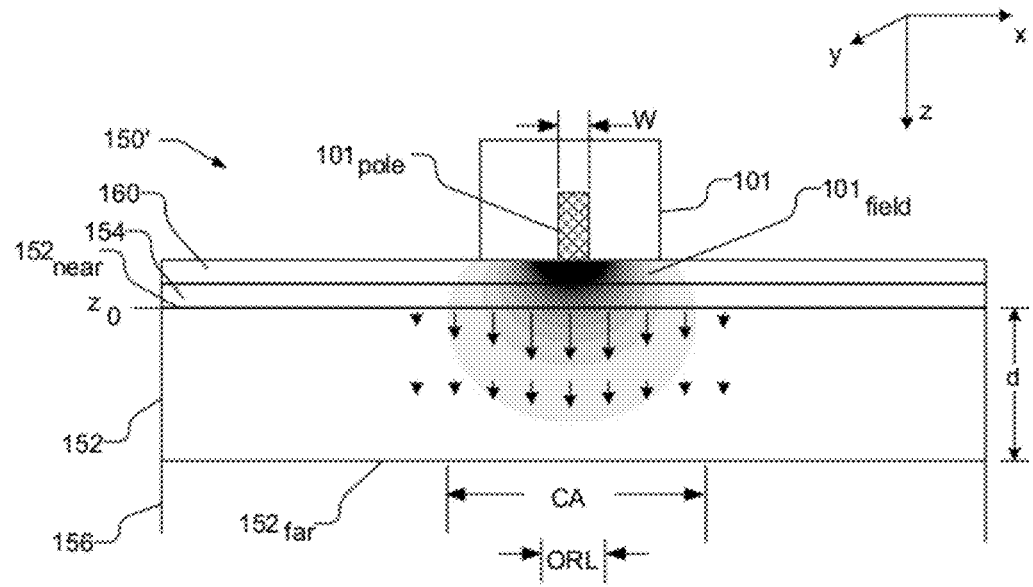
FIGS. 4B and 4C illustrate a cross-sectional view of a magneto-optical transducer, including a ferrimagnetic garnet film and a reflective layer and overlying magnetic layers, along with a sample in the form of a write head, including a write pole.
Figure 4C:
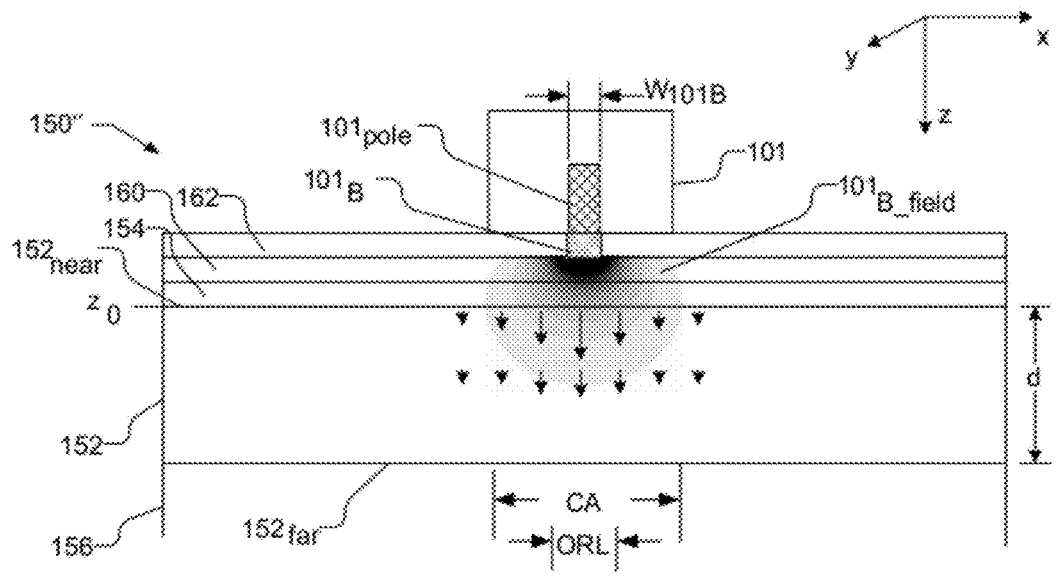
Figure 4D:
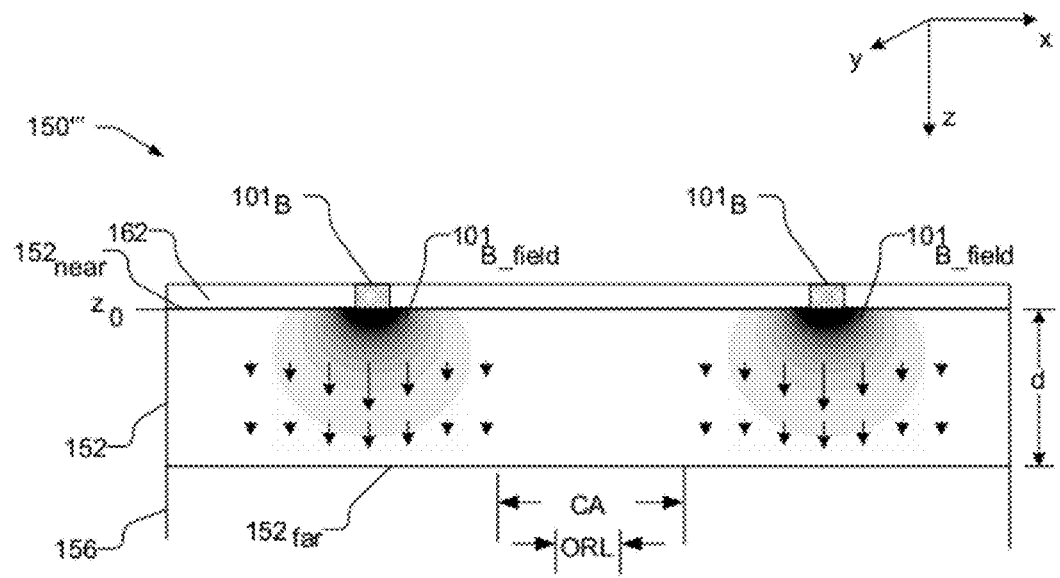
FIG. 4D illustrates a cross-sectional view of a magneto-optical transducer with an overlying magnetic recording layer with multiple written bits that remain after the sample is removed.

FIG. 3D illustrates a projection of magnetic field producing structure when the magnetic field producing structure is a bit imprinted on a magnetic recording layer 162 that overlies the magnetic layer 152, such as that shown in FIGS. 4C and 4D. By way of example, when the sample 101 is a HAMR write head, the written imprint on the magnetic recording layer 162 is caused by simultaneously heating the magnetic recording layer 162 with, e.g., a laser, and applying a magnetic field by the write pole. Thus, unlike a conventional write head, the shape of the imprint on magnetic recording layer 162 is determined by the shape of the heated area, which because it is produced by a laser and aperture, will most likely be shaped as a circle $101_{bit}$ or ellipse (if the laser is at an angle with respect to the magnetic recording layer 162), or some other laser/aperture dependent shape, regardless of the shape of the write pole of the head. Thus, the longest linear dimension of the magnetic field producing structure $101_{bit}$ is the diameter (D) of the circle or the longest axis of an ellipse.

FIG. 4A illustrates a cross-sectional side view of the magneto-optical transducer 150, including a magnetic layer 152 that is, e.g., a ferrimagnetic garnet film 152, and a reflective layer 154, along with a write head sample 101 that includes a write pole $101_{pole}$ that produces a magnetic field $101_{field}$. FIGS. 4B and 4C are similar to FIG. 4A but illustrate another embodiment of the magneto-optical transducer. Referring to FIG. 4A, the ferrimagnetic garnet film 152 has an in-plane magnetization, which is disturbed by the perpendicular component of the magnetic field $101_{field}$ along the optical axis that is produced by the write pole $101_{pole}$ to induce an out-of-plane rotation of the magnetization of the magnetic layer 152. The vertical component of the magnetization of the magnetic layer 152 is illustrated by arrows 152v1 and 152v2. Areas with an out-of-plane rotation of the magnetization of the magnetic layer 152 can be optically detected by the polarization microscope, e.g., illustrated in FIG. 1A, as a contrast with areas having no out-of-plane rotation, herein referred to as a magneto-optic contrast. Thus, the effect of the magnetic field $101_{field}$ on the magnetization of the magnetic layer 152 can be optically detected by device 100 as a magneto-optic contrast if the affected area is larger than the optical resolution limit of the optics of the device 100.

However, the source of the magnetic field $101_{field}$, e.g., sample 101, has a magnetic field producing structure, e.g., write pole $101_{pole}$, with a projection $101_{projection}$ that has a largest linear dimension illustrated as W, that is below the optical resolution of the optics of the device 100, illustrated as ORL in FIG. 4A.

It should be understood that the write pole $101_{pole}$ may have one or more dimensions, such as its height, that is greater than the optical resolution limit of the optics of the device 100, however, the largest linear dimension of the projection of the magnetic field producing structure is below the optical resolution limit of the optics. By appropriate configuration of the device 100, the area of the magnetic layer 152 of the magneto optical transducer 150 that is affected by the magnetic field $101_{field}$ to produce a Contrast Area (CA) on the magneto optical transducer 150 has a linear dimension that is large enough to be resolved by the optics of the device 100. The device 100 may be configured to produce a large Contrast Area (CA), e.g., by holding the sample 101 close to the magnetic layer 152 by limiting the thickness of any intervening layers, including the reflective layer 154 and any protective layer 158 (shown in FIG. 2A), to less than, e.g., the largest linear dimension of the projection of the field producing structure. By way of example, the sample 101 may be held less than approximately 100 nm from the magnetic layer 152. Additionally or alternatively, the saturation field of the magnetic layer 152 is configured to be sufficiently lower than the magnetic field produced by the sample 101 so that the area of change in magnetization in the magnetic layer 152, e.g., CA, is larger than the optical resolution of the optics ORL of the device 100. By way of example, when the optics of the device 100 have an optical resolution limit of 624 nm or even down to 275 nm, and the magnetic layer 152 is a garnet film, the saturation field of the magnetic layer 152 may be at least one order of magnitude lower than the magnetic field produced by a write head sample 101, or at least 50% lower in the case of a resolution limit of 275 nm. For a given optical resolution limit of 624 nm or even down to 275 nm, the saturation field of a magnetic layer 152 of, e.g., NiCr, NiFeCr, NiFe, CoFe, or CoNiFe, may be at least 30% lower than the magnetic field produced by the write head sample 101. If the spacing between the sample 101 and the magnetic layer 152 is greater than the largest linear dimension of the projection of the field producing structure, the saturation field of the magnetic layer 152 may be appropriately reduced to produce an area of change in magnetization in the magnetic layer 152, e.g., CA, that is larger than the optical resolution of the optics ORL of the device 100.

As illustrated in FIG. 4A, the magnetic field $101_{field}$ that is produced by the magnetic field producing structure of the sample, e.g., the write pole $101_{pole}$, is small and has a sharp field gradient in the z-direction so that the garnet magnetization does not uniformly saturate through the thickness d of the magnetic layer 152, e.g., when a garnet film is used as the magnetic layer 152. For example, as can be seen in FIG. 4A, the particular component of the magnetic field $101_{field}$ is significantly different at the surface $152_{near}$ near the sample 101 with respect to the surface $152_{far}$ opposite the sample 101. The sharp gradient of the magnetic field $101_{field}$ results in a non-uniform rotation of the magnetization (saturation) through thickness of the magnetic layer 152 as indicated by the lengths of the vertical components of the magnetization of the magnetic layer 152 illustrated as arrows 152v1 and 152v2. In other words, while the magnetic layer 152 directly under the sample 101 is fully saturated at the surface $152_{near}$ near the sample 101, the magnetic layer 152 directly under the sample 101 is not fully saturated at the opposite surface $152_{far}$. Thus, at a location directly under the write pole $101_{pole}$, the magnetization of the magnetic layer 152 has some in-plane field orientation, e.g., at the surface $152_{far}$. Moreover, even if the magnetic field $101_{field}$ is extremely high with respect to the saturation field of the magnetic layer 152, the magnetic layer 152 will not fully saturate, i.e., some in-plane field orientation is retained, at the location that corresponds to the center of the write pole $101_{pole}$, because the separation $z_0$ between the write pole $101_{pole}$ and the magnetic layer 152 and the thickness d of the magnetic layer 152 are large relative to the rate of decay of the magnetic field $101_{field}$. Thus, the separation between the sample and the magnetic layer, e.g., the thicknesses of the reflective layer 154 and any protective layer 158, the thickness of the magnetic layer 152 and the saturation field of the magnetic layer 152 may be configured so that at no location of the magnetic layer 152 is fully saturated through the thickness of the magnetic layer, i.e., from surface $152_{near}$ to surface $152_{far}$. Accordingly, there is a non-uniformity in the magnetization through the thickness of the magnetic layer 152. For example, with a high magnetic field $101_{field}$ from the sample relative to the saturation field of the magnetic layer 152, the magnetic layer 152 will be saturated if the distance between the sample and a particular point in the magnetic layer 152 is smaller than the largest linear dimension of the projection of the sample $W_{pole}$, which may be 100 nm. Thus, if the reflective layer 154 and protective layer 158 have a combined thickness, e.g., distance $z_0$, of less than the width of the sample, approximately 100 nm, the near surface $152_{near}$ of the magnetic layer 152 will be saturated. With a magnetic layer 152 having a thickness d of 0.3 μm to 5 μm, the distance from the sample will be sufficient that the opposite surface $152_{far}$ will not be saturated. The non-uniform rotation of the magnetization through the thickness of the magnetic layer 152 can be used to detect variations in the performance of different samples, i.e., discriminate sample performance, as well be used to determine field magnitude and sample geometry.

FIG. 4B is similar to FIG. 4A, like designated elements being the same. The magneto-optical transducer 150' of FIG. 4B, however, has a magnetic film 160 between the write head sample 101 and the magnetic layer 152. In one embodiment, as illustrated in FIG. 4B, the magnetic film 160 is deposited over the reflective layer 154. In another embodiment, however, where the magnetic film 160 is sufficiently reflective, the magnetic film 160 may take the place of the reflective layer 154, i.e., reflective layer 154 is not used. The magnetic film 160 may not be as reflective as the reflective layer 154, but by removing the reflective layer 154 and relying on the magnetic film 160 as the reflective layer, the sample 101 will be closer to the magnetic layer 152, and thus, may provide a net benefit. The magnetic film 160 may be similar to a soft underlayer (SUL) used on a perpendicular magnetic recording medium to be used with the write head sample 101. The SUL magnetic film 160 may be deposited on the reflective layer 154, or the magnetic layer 152 where the reflective layer 154 is not used, by sputtering or other conventional technique and may require the use of an appropriate seed layer. The use of a magnetic film 160 on the magneto-optical transducer 150' may be advantageous as it more closely simulates the actual operation of the write head sample 101, e.g., by providing a path for the magnetic field to return to the write head sample 101. The sample 101 may produce a magnetic field, which produces a magnetic field in the SUL magnetic film 160. The resulting magnetic field $160_{field}$ changes the magnetization of the magnetic layer 152 to an area CA that is greater than the optical resolution limit ORL of the optics of the device 100. Thus, the effect of the magnetic field from the sample 101 may be imaged for analysis via the magneto-optical transducer 150 that includes the magnetic SUL film 160.

FIG. 4C is similar to FIG. 4B, like designated elements being the same. FIG. 4C, however illustrates a magneto-optical transducer 150" that includes an additional magnetic recording layer 162, similar to a recording storage layer on a perpendicular magnetic recording medium to be used with the write head sample 101. The magnetic recording layer 162 may be deposited over the SUL magnetic film 160 using conventional techniques used in the disk drive industry. It should be understood that additional layers may be present, such as a separation layer between the SUL magnetic film 160 and the magnetic recording layer 162. Alternatively, one or both of the reflective layer 154 and the SUL magnetic film 160 may be removed. For example, the magnetic recording layer 162 may be deposited directly on the magnetic layer 152, via a seed layer, without the underlying SUL magnetic film 160 or the reflective layer 154, e.g., when the magnetic recording layer 162 is sufficiently reflective. The use of the magnetic recording layer 162 on the magneto-optical transducer 150' again may be advantageous as it more closely simulates the actual operation of the write head sample 101. A magnetic field produced by the write head sample 101 writes a bit $101_B$ to the magnetic recording layer 162, as illustrated in FIG. 4C. The magnetic bit $101_B$ is typically about the size of the write pole $101_{pole}$, or smaller, such as with HAMR type write heads, and has an area $W_{101B}$ below the optical resolution ORL of the optics. The resulting magnetic bit $101_B$, however, produces a magnetic field $101_{B\_field}$ that through the magnetic SUL film 160 changes the magnetization of the magnetic layer 152 in an area CA that is greater than the optical resolution limit ORL of the optics of the device 100. Thus, as illustrated in FIG. 4C, the recorded magnetic bit $101_B$ acts as the magnetic field producing sample and the magnetic field produced by the magnetic bit $101_B$ can be imaged via magneto-optical transducer 150", from which information about the magnetic bit $101_B$ and, thus, the write head sample 101 that produced the magnetic bit $101_B$ can be obtained. The use of the magneto-optical transducer 150" with the SUL magnetic film 160 and magnetic recording layer 162 may be advantageous to determine performance characteristics of write heads, such as the magnetic write width. Moreover, magneto-optical transducer 150' may be used with HAMR type write heads to measure the performance of the non-magnetic thermal element. It may be useful when the magneto-optical transducer 150" includes a magnetic recording layer 162 to write to the magnetic recording layer 162 twice at different polarities, where the magnetic bit $101_B$ is cleared between writing using AC ring-down by the sample 101, or the magnetic field source 196 or by a magnetic source external to device 100. As discussed above, a DC bias may be applied to the magnetic recording media, e.g., by the magnetic field source 196 or by a magnetic source external to device 100, where a bit is written with opposite polarity, in order to maximize the magneto-optic contrast.

The use of the magnetic recording layer 162 has the advantage that the bit $101_B$ can be written offline, and the magneto-optical transducer 150" can be imaged later as an assembly. Alternatively, the sample 101 may be loaded, the bit $101_B$ written, and the sample unloaded and the bit $101_B$ imaged later, which is advantageous as the remanence from the write pole does not impact the analysis of the written-bit. Additionally, the throughput may be improved by imaging the written bit while unloading and loading the next test sample. Further, without the magnetic recording layer 162, a static bias is applied to the sample (writer) during imaging, which may be approximately 50 ms with a typical CCD camera. The characteristics of the writer/electromagnet may be different during AC/pulsed writing vs. DC writing, due to characteristics in the write driver such as Overshoot. Thus, with the use of the magnetic recording layer 162, real write conditions are simulated as close as possible by using a single pulsed write bias to write the bit $101_B$. Further analysis is also possible by measuring the size of the written bit $101_B$ as a function of write pulse duration. Additionally, the device could be used as a media analysis tool as opposed to a write head tester. In other words, the magneto-optical transducer 150" may be used to compare different media properties, e.g., by using two or more types of media as the magnetic recording layer 162 and comparing the resulting written bit produced with the same or similar write heads.

FIG. 4D is similar to FIG. 4C, like designated elements being the same. FIG. 4D, however, illustrates the magneto-optical transducer 150''' with the magnetic recording layer 162 directly on the magnetic layer 152, i.e., with no intervening layers, except any seed layer necessary for deposition, which for purposes of this disclosure is not considered an intervening layer. As can be seen in FIG. 4D, multiple bits $101_B$ may be written to the magnetic recording layer 162 and the bits $101_B$ remain after the sample 101 is removed. For example, the bits may be written at different location by moving the sample 101 or the magneto-optical transducer 150''' using actuator 190. The bits $101_B$ can then be imaged without the presence of the sample 101. It should be understood that multiple bits $101_B$ may also be written on magneto-optical transducer 150", which includes magnetic recording layer 162 over the SUL magnetic film 160 as shown in FIG. 4C. Thus, with magneto-optical transducer 150''', it is possible to test a write field response, e.g., while a write current is produced to the sample 101, and to test for remanence. For example, the write field response of the magnetic layer 152 to a write current provided to a sample 101 may be imaged while the write current is produced. The remanence could not be imaged at the pole because a bit will be written in the magnetic recording layer 162 directly under the pole, unless the write current used during the write field response measurement is chosen to be less than the coercivity of the magnetic recording layer 162 so that a bit is not actually written to the magnetic recording layer 162. Additionally, after the write field response test a bit field response test may be performed, i.e., testing the field produced by the written bit on magnetic recording layer 162, before and/or after moving the sample 101. One possibility is writing with the sample 101 with the opposite polarity to clear the bit from the magnetic recording layer 162, by reorienting the bit back in the same direction as the initialized media. This would not require an external magnet to erase the bit. Additionally, write current sweeping may be performed and tested. For example, a write current sweep may be used to clear the bit. By increasing the write current, there may be no need to erase the bit between steps in the write current sweep, for example, if the bit intensity is measured during the sweep, where the written area will continue to increase in size proportionally to write current so that absolute and relative increases in the magneto-optic contrast may be measured. After stopping the write current, the sample 101 may be optionally unloaded and the bit recorded on the magnetic recording layer 162 imaged after unloading the sample 101.

Thus, as illustrated in FIGS. 4A, 4B, 4C, and 4D, the effect of the magnetic field produced by the write pole $101_{pole}$ can be optically detected by the device 100 and using the optically detected information, desired characteristics of the sample 101 can be determined. For example, the optically detected magneto-optic contrast may be used to distinguish between nominal write head performance and heads with severe magnetic or mechanical problems including corrosion of the write pole. For example, by comparing the optically detected contrast to a threshold or a reference value, it can be determined if the sample is good. Moreover, through appropriate data processing, the optically detected magneto-optical contrast may be used to provide quantitative information on the field strength and to extract pole dimensions. Additional information that may be determined include overwrite (OW) and magnetic write width related information, head efficiency, saturation, pole remanence, missing or corroded write pole, variation of physical pole dimensions, and write gap variation. Additionally, information may be obtained for magnetic recording media.

Figure 5:
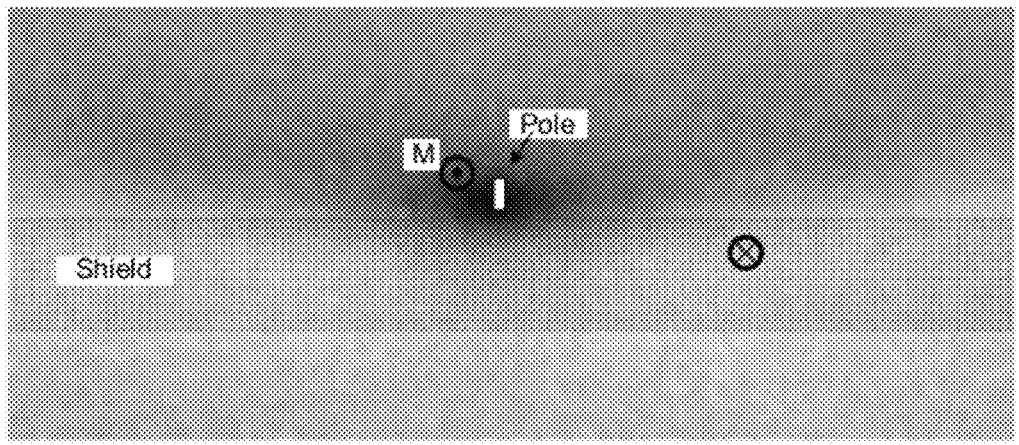
FIG. 5 illustrates an example of a magneto-optic contrast image from a magneto-optical transducer.

FIG. 5 illustrates an example of a magneto-optic contrast image from a magneto-optical transducer 150. In FIG. 5, the darker areas correspond to the field components from the sample, e.g., the write pole, that are pointing into the plane, whereas the lighter contrast are field components that are pointing out of the plane. The image shows the magneto-optic contrast produced by the magnetic field from a write pole, which is illustrated by a solid box (not drawn to scale), where field components pointing into and out of the plane create a magneto-optic contrast and the intensity of the contrast is proportional to the field strength. Also illustrated in FIG. 5 is the effect on the magnetization of the magneto-optical transducer caused by the magnetic field from the shield of the write head, where both the pole and the shield are physically located on the opposite side of the magneto-optical transducer.

Figure 6:
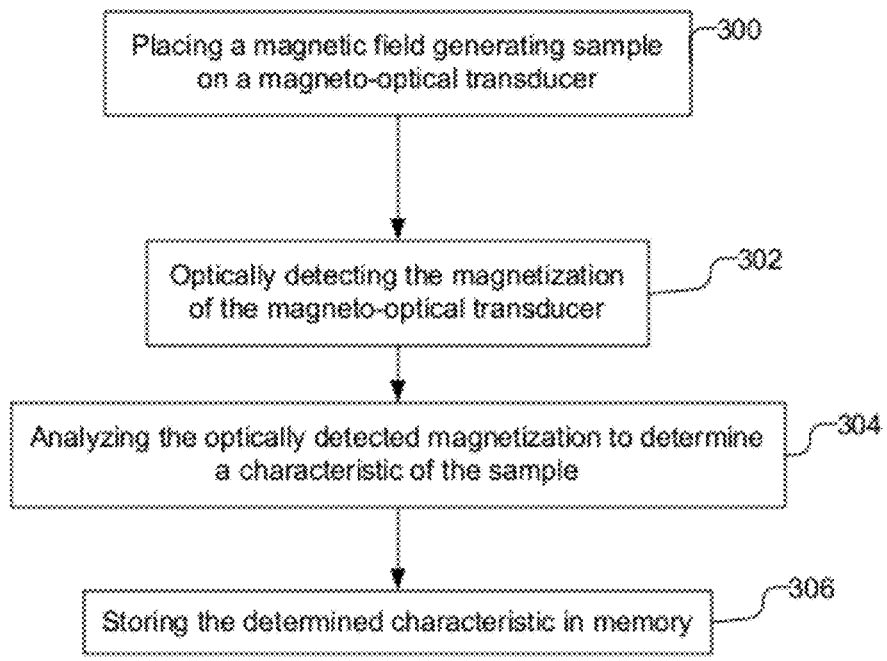
FIG. 6 is a flow chart illustrating an embodiment of measuring a characteristic of a magnetic field generating sample using a magneto-optical transducer.

FIG. 6 is a flow chart illustrating an embodiment of measuring a characteristic of a magnetic field generating sample using a magneto-optical transducer. The magnetic field generating sample is placed on a magneto-optical transducer (300) that has a saturation field that is lower than the magnetic field of the sample so that the area CA of the transducer that is affected by the magnetic field is optically resolvable, when the magnetic field generating structure is below the optical resolution ORL of the optics of the device 100. While the magnetic field generating sample is producing a magnetic field, e.g., while applying a write current to a write head, the effect of the magnetic field on the magnetization of the magneto-optical transducer is optically detected (302). By way of example, the magnetization of the magneto-optical transducer may be imaged using a camera or the intensity of the light detected, using a photodetector. If desired, the magnetization of the magneto-optical transducer may be optically detected when different write currents are applied to the sample. For example, to increase the magneto-optic contrast, the magnetization of the magneto-optical transducer may be optically detected for negative and positive write currents and the two optically detected magnetizations are subtracted to eliminate light that has no magnetic information, which can also be done for different absolute magnitude write currents. Further, if desired, the magnetization of the magnet-optical transducer may be optically detected for zero write current (e.g., with or without the sample present) which is then subtracted from subsequent optically detections of magnetizations to eliminate light that has no magnetic information, which can also be done for different absolute magnitude write currents. Additionally, if desired, the magnetization of the magneto-optical transducer may be optically detected while exercising the DFH device or a microactuator device that may be present on a write head sample. Further, the temperature of the sample may be controlled, e.g., cooled or heated, while optically detecting the magnetization. Also, an external bias field may be applied, and in the case that the magnetic recording layer 162 is used, the external bias can be used to saturate the magnetic recording layer 162 in one direction or randomly with AC erasure.

The optically detected magnetization can then be analyzed to determine a characteristic of the magnetic field sample (304). For example, the optically detected magnetization, or at least a portion of the data, can be compared to a threshold, a reference value, or a library of information, which may be produced empirically or theoretically by modeling. The determined characteristic can then be stored in memory, e.g., memory 134 in processor 130 (306) or otherwise reported, e.g., displayed by display 136. Where images are captured, the images may be stored in memory, e.g., memory 134. It should be understood that storing the determined characteristic in memory may be long term storage of data or it may be temporarily stored, for example, in order to display the result on a monitor or print the result. The determined characteristic can be used to, e.g., accept or reject samples with unsatisfactory characteristics or to separate, e.g., bin, samples based on performance. Further, the determined characteristics may be used in process feedback control in the production of samples. Additionally, the determined characteristics may be used in the evaluation and/or comparison of sample designs.

Figure 7:
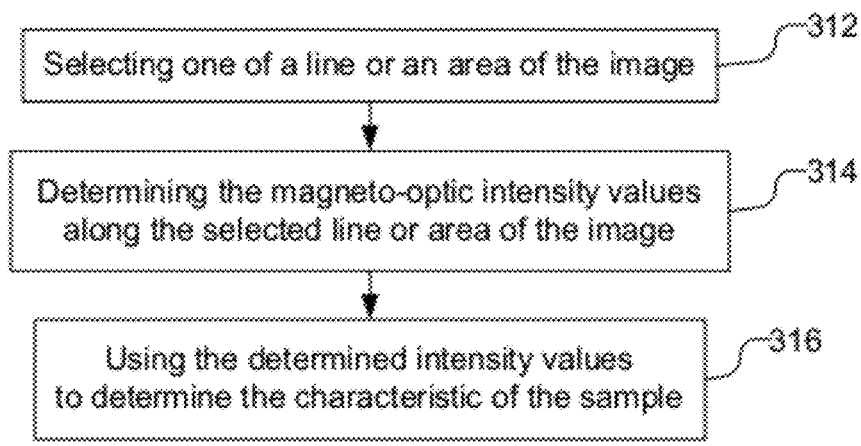
FIG. 7 is a flow chart illustrating an embodiment of the analysis of the image that may be performed.

FIG. 7 is a flow chart illustrating an embodiment of the analysis of the optically detected magnetization that may be performed. Once the magneto-optic contrast is optically detected, the area of interest is found by selecting, e.g., a line or area of an image (312). The selection of a line or an area is based on the type of analysis to be done. Moreover, area of interest may be selected based on the location of the magnetic field producing structure, which may be determined based on the greatest intensity in the magneto-optic contrast. The intensity of the magneto-optic contrast along the selected line or within the area is then determined (314). If desired, the intensity of the magneto-optic contrast may be normalized, e.g., by determining a intensity ratio, offset or some combination. For example, the intensity of the magneto-optic contrast along the selected line or within the area may be relative to another intensity value to form a contrast ratio. The contrast ratio could be with respect to, e.g., a different portion of the selected line or area but at a suitable distance from the sample that it is not affected by a field from the sample, or from a different portion of the same image altogether, e.g., in a corner of the image, or a previous reference image. Alternatively, an offset may be used by subtracting a baseline measurement derived from another portion of the line, area, or other image from the measured intensity of the magneto-optic contrast. In one embodiment, a magneto-optic contrast line profile may be produced. The determined intensity values can then be used to determine the desired characteristic of the sample, e.g., by comparing the intensity to a threshold or reference values, a library of information, which can be generated empirically or theoretically by modeling (316). Moreover, the determined intensity value(s) may be used to calculate desired characteristics such as geometrical information. A normalized magneto-optic contrast distribution may be fit to a magneto-optic model to extract geometrical and field intensity data. For example, the 50% half-width of a normalized line profile may be used to calculate desired geometrical information. In another example, the intensity of the magneto-optic contrast over an area, e.g., that coincides with the approximate location and area of the write pole, may be averaged to determine a peak intensity, which may be used to determine a characteristic of the write pole such as whether it is functioning or to determine other characteristics. Further, a contrast gradient may be calculated, e.g., using intensity values derived from optically detected magnetization values produced at different write currents. Another analysis may be the deconvolution of the optical resolution of the optics from the magneto-optic contrast image. Another analysis may be a subtraction of stray fields coming from the flare of the writer, or from remanences or domains, or other field sources that may be subtracted from the contrast to further distinguish the field produced from the write pole.

As discussed above, a library may be generated empirically or theoretically by modeling. Modeling techniques may also be used to calculate certain characteristics of a sample. For example, by knowing specific parameters, such as the saturation field and thickness of the magnetic layer 152, along with the separation between the sample and the magnetic layer 152 and optical parameters of the optical elements of the device 100, geometrical dimension of a sample may be calculated once the magnetic field of the sample is determined.

Figure 8A:
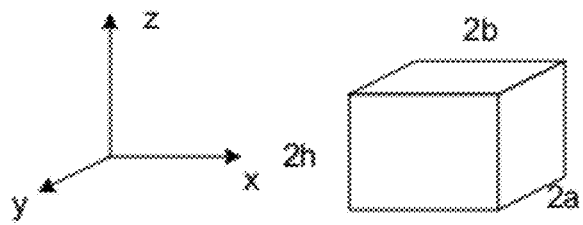
FIGS. 8A and 8B illustrate a magnetized cube and write pole field that can be used to model the magneto-optic contrast.
Figure 8B:
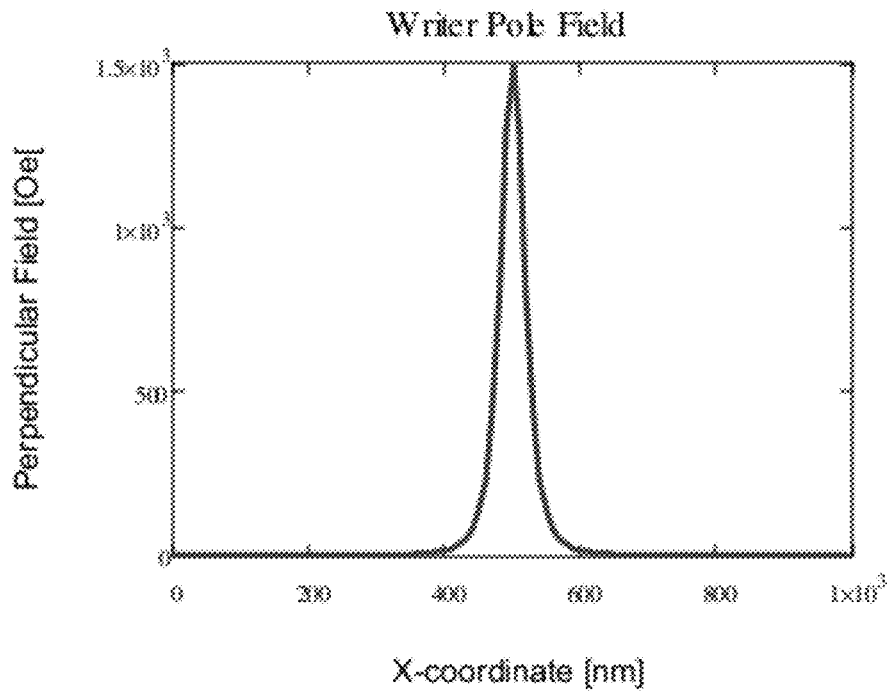

In order to model the optically detected magnetization from the magneto-optical transducer 150, the dimensions of a magnetized cube (modeling a write pole), as illustrated in FIG. 8A is produced and the three dimensional field for the magnetized cube is calculated, e.g., based on the Biot-Savart Law, or other appropriate means. By way of example, FIG. 8B illustrates the perpendicular magnetic field produced by the magnetized cube of FIG. 8A along the x-coordinate.

With the magnetic field from the structure calculated, the magnetic field is averaged over the magnetic layer thickness based on the thickness of the magnetic layer 152 (i.e., thickness d shown in FIG. 4) and the separation between the sample and the magnetic layer 152 (distance $z_0$ shown in FIG. 4) as follows:

$$Hav(x, y) := d^{-1} \cdot \int_{z0}^{z0+d} Hz(x, y, z) dz. \quad \text{Equation 2}$$

Moreover, the effect that the magnetic field has on the magnetization of the magnetic layer 152, e.g., the magneto-optic contrast, can be determined as:

$$MO(x,y) \propto Hav(x,y)|_{H(x,y,z) \leq Hsat,garnet} \quad \text{Equation 3}$$

where Hsat,garnet is the saturation field of the magnetic layer 152.

Figure 9:
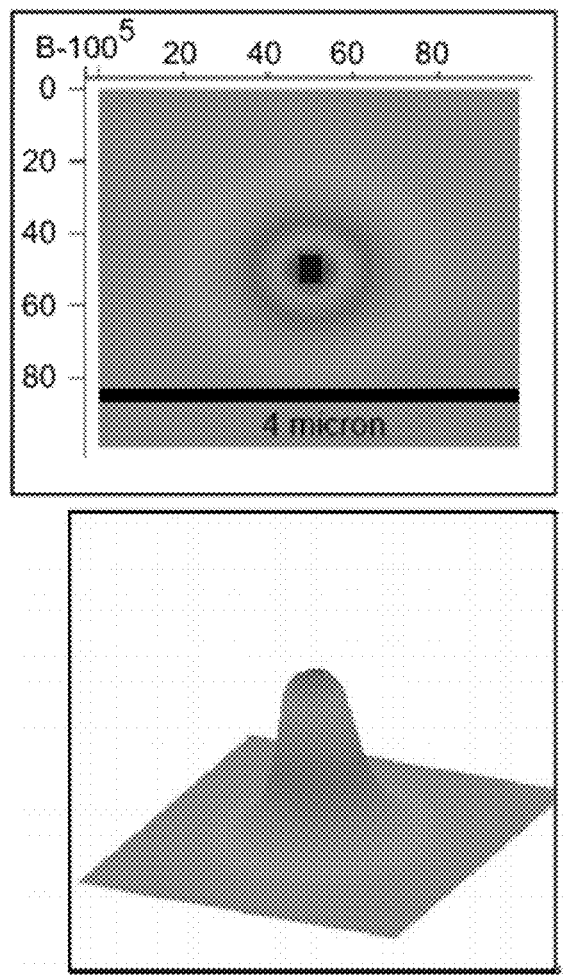
FIG. 9 illustrates 2-D and 3-D graphs of the calculated magneto-optic contrast of the write pole field as imaged using a magneto-optical transducer.

FIG. 9 illustrates the modeled magneto-optic contrast that may be imaged using the magneto-optical transducer 150 when exposed to a magnetic field from the modeled write pole. The calculated magneto-optic contrast is based on a write pole having a width w of 220 nm, the magnetic layer 152 having a thickness d of 1000 nm, and a spacing $z_0$ of 40 nm from the write pole, and a magnetic field H from the write pole of 1.8 Tesla, and a magnetic layer 152 saturation $H_{sat}$ of 750 Oe. It has been determined that the magneto-optical spatial contrast resolution is not diffraction limited, but is mainly determined by the magnetic layer 152 thickness d and the spacing $z_0$ between the magnetic layer 152 and the sample, e.g., the thickness of the reflective layer 154.

Figure 10:
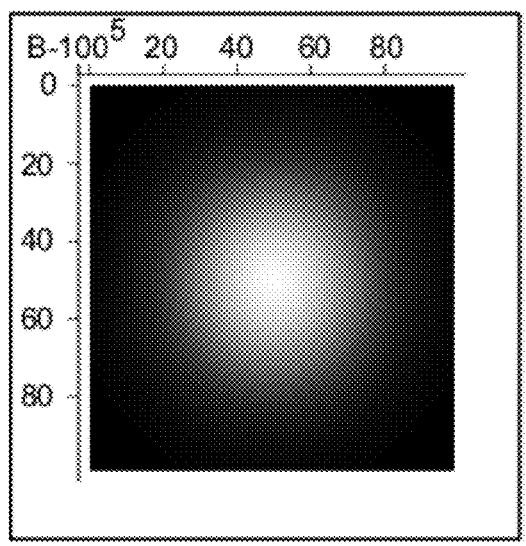
FIG. 10 illustrates the optical resolution of the optics that is modeled using a Gaussian spatial function.

The optics in the polarization microscope have a limited optical resolution. FIG. 10, for example, illustrates the optical resolution of the optics that are modeled using a Gaussian spatial function S, where half-width s=600 nm, as follows:

$$S(x, y) = \frac{1}{s\sqrt{\pi/2}} \cdot e^{-2\left(\frac{x^2+y^2}{s^2}\right)} \quad \text{Equation 4}$$

The modeled magneto-optic contrast distribution, thus, must be modified based on the optical resolution. Thus, to determine the expected image of the magneto-optical transducer the convolution of the Gaussian function with the magneto-optic contrast distribution may be calculated as:

$$f(x,y) = \iint S(x_s, y_s) \cdot Hav(x-x_s, y-y_s) dx_s dy_s \quad \text{Equation 5}$$

FIGS. 11A and 11B are graphs illustrating modeled calculations of the impact of the magnetic field variation and the width of the magnetic structure on the imaged magneto-optic contrast, respectively. FIG. 11A illustrates a curve 202 calculated based on a write pole $101_{pole}$ with a width of 122 nm and a field amplitude of 1.8 T and a curve 204 calculated based on the same size write pole $101_{pole}$ and a field amplitude of 2.6 T. FIG. 11B illustrates two curves 206 and 208 that were calculated based on write poles $101_{poleA}$ and $101_{poleB}$ having respective widths of 122 nm and 84 nm and the same magnitude magnetic field amplitudes of 1.8 T. As can be seen, the write-field strength and the pole width have a different impact on the magneto-optic contrast distribution and, thus, can be treated as independent variables when fitting data to the model. Thus, dimensional information of the sample may be extracted by analyzing the contrast intensity of a selected area of the magneto-optic contrast image.

FIG. 12 shows an image of the magneto-optic contrast of a write head sample along with a 3-D rendering. The magneto-optic contrast is for a write head with a write pole of approximately 100 nm and a write current of 50 mA. The edge of the shield of the write head is also illustrated for orientation.

Figure 13:
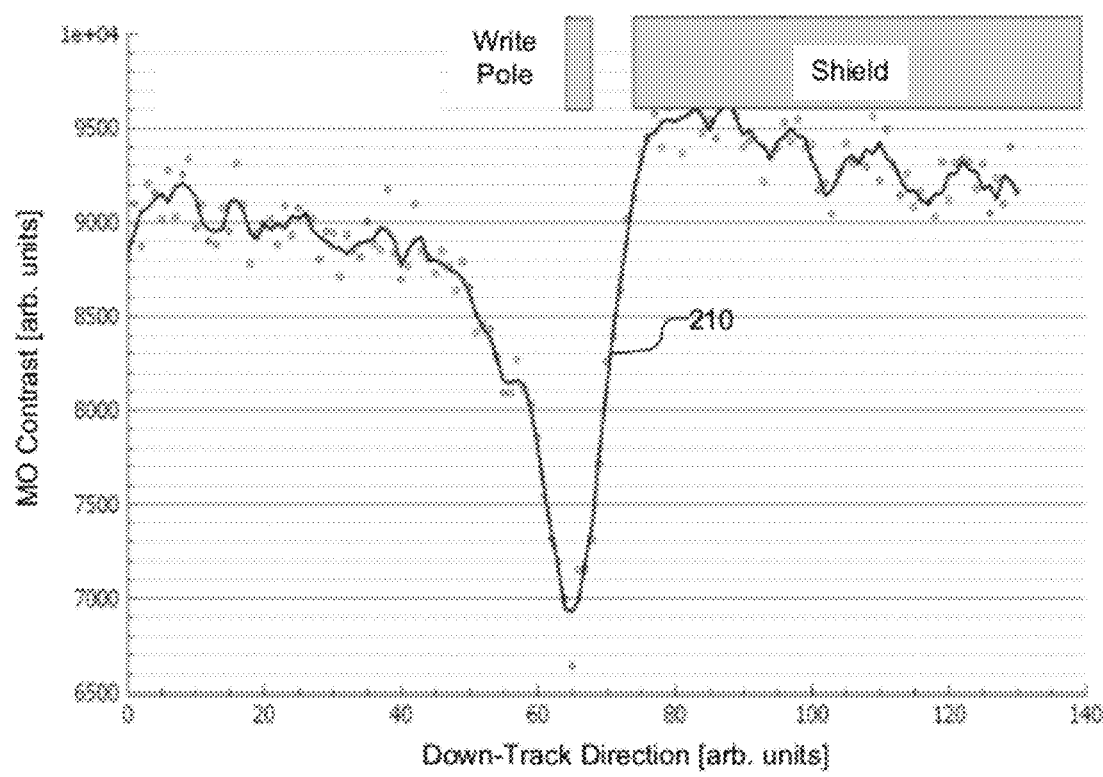
FIG. 13 is a graph illustrating the down track line profile of the magneto-optic contrast, where the x-axis represents the down-track direction and the y-axis represents the magneto-optic contrast.

FIG. 13 is a graph illustrating the measured down track line profile of a magneto-optic contrast, where the x-axis represents the down-track direction and the y-axis represents the magneto-optic contrast. The line profile is taken along a magneto-optic contrast image in the direction illustrated by line 250 in FIG. 12. The approximate positions of the write pole and the shield are also illustrated in FIG. 13 for the sake of reference. Using the line profile, several characteristics of the sample may be determined. For example, the amplitude of the line profile provides information related to the field strength. By comparing the measured amplitude to reference values, e.g., in a library, or through modeling, the measured contrast values can be used to determine the strength. Moreover, the write gap, i.e., the gap between the write pole and the shield, may be determined from the line profile based on the slope of the line at 210, i.e., between the peak that corresponds to the write pole and the plateau that corresponds to the shield. Additionally, the half-width of the peak may be used to derive dimensional information as discussed above.

Figure 14:
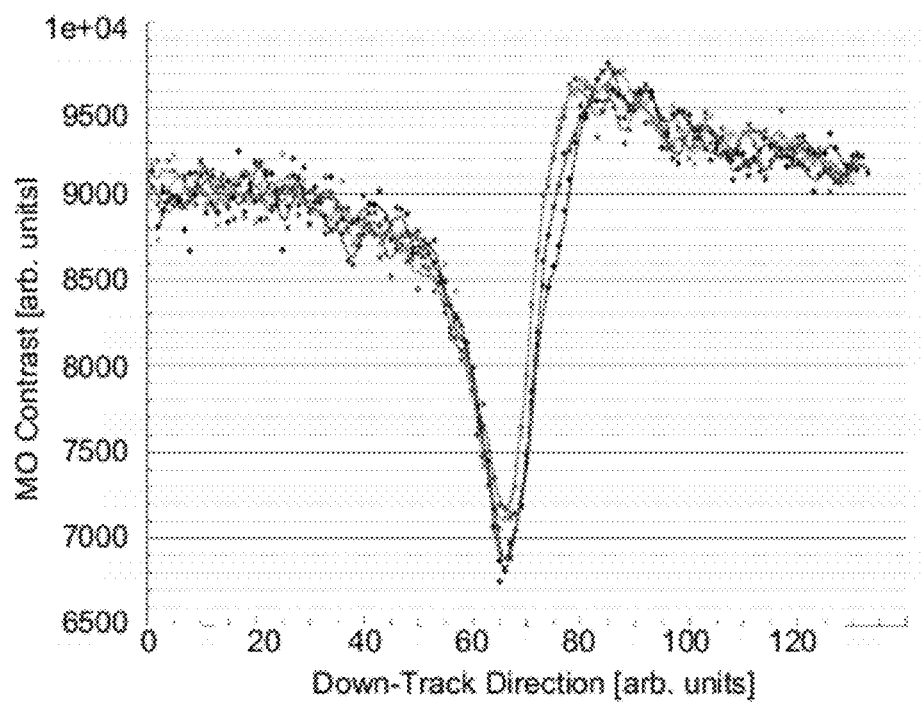
FIG. 14 is a graph, similar to that shown in FIG. 13, illustrating the down track line profile of the magneto-optic contrast for write heads with a different overwrite (OW).
Figure 15:
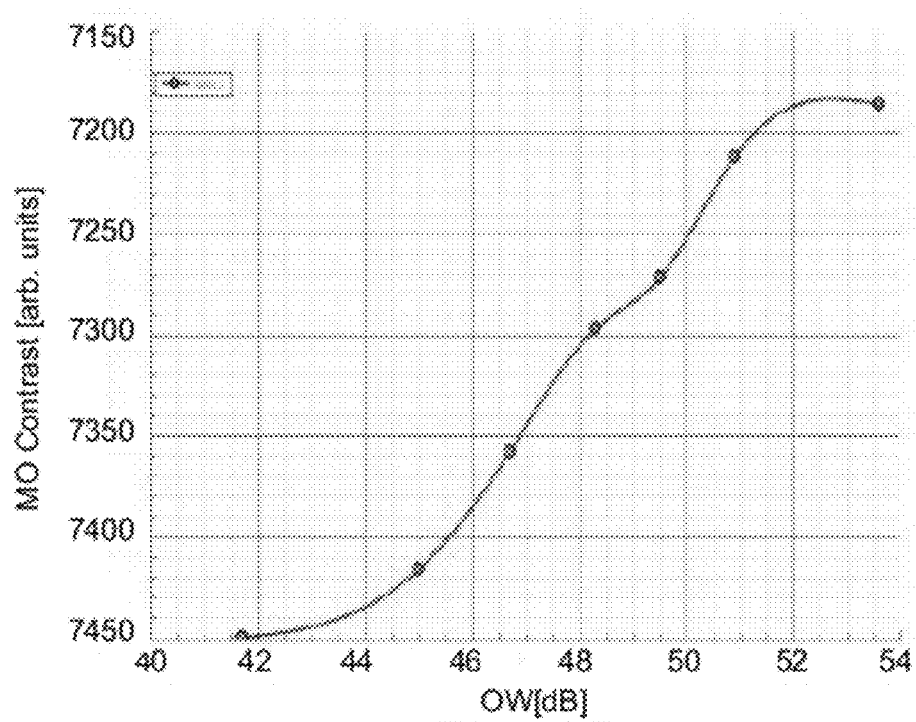
FIG. 15 is a graph illustrating the magneto-contrast as a function of OW from different write heads, where the x-axis represents OW (dB) and the y-axis represents magneto-optic contrast in arbitrary units.

FIG. 14 is a graph similar to that shown in FIG. 13, illustrating the down track line profile of the magneto-optic contrast for write heads with different overwrite (OW). The write heads with low OW show a reduced peak magneto-optic contrast. Similarly, it has been found that write heads with shield corrosion produce a much lower peak contrast compared to good write heads. FIG. 15 is a graph illustrating the magneto-contrast as a function of OW for seven different write heads, where the x-axis represents OW (dB) and the y-axis represents magneto-optic contrast in arbitrary units. The contrast in FIG. 15 was integrated over a small area in the image equivalent to approximately the square of the pole width. Thus, as can be seen, the OW characteristic of a head may be determined based on analysis of the peak magneto-optic contrast. For example, the OW can be determined by comparing the peak magneto-optic contrast of an unknown head to the peak magneto-optic contrast of heads with a known OW. Alternatively, the OW can be characterized by determining the magneto-optic contrast at the pole and comparing the determined contrast to a database of OW versus contrast, such as illustrated in FIG. 15. Magnetic Write Width MWW may be determined in the same manner, since this peak-contrast technique may be used for either/both OW and MWW correlation.

Figure 16:
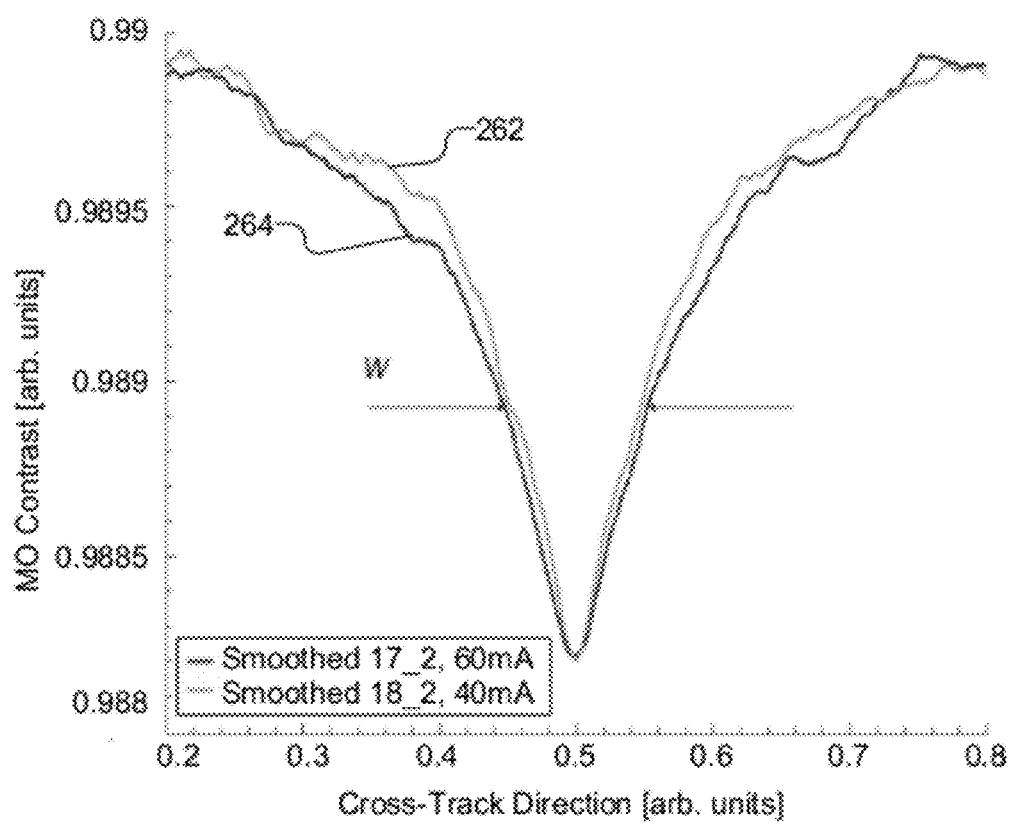
FIG. 16 is a graph that illustrates normalized cross track line profiles of the magneto-optic contrast, where the x-axis represents the cross track direction and the y-axis represents the magneto-optic contrast.

FIG. 16 is a graph that illustrates normalized cross track line profiles of the magneto-optic contrast, where the x-axis represents the cross track direction and the y-axis represents the magneto-optic contrast. The cross track direction is taken along a magneto-optic contrast image in the direction illustrated by line 252 in FIG. 12. Curves 262 and 264 in FIG. 16 represent the magneto-optic contrasts produced by a write head using write currents of 40 mA and 60 mA, respectively. As can be seen, with the normalized line profiles, the 50% half-width W does not significantly change. In other words, the physical dimensions of the write pole may be extracted from a cross track line profile, such as those shown in FIG. 16, and variations of the write-field and overwrite should have little effect on the extracted physical dimensions. Dimensional information of the sample may be extracted by analyzing the contrast intensity of the selected area with respect to a library of reference data or by e.g., using the determined intensity along with known magneto-optical transducer and optics parameters to calculate the dimensions as discussed above.

Figure 17A:
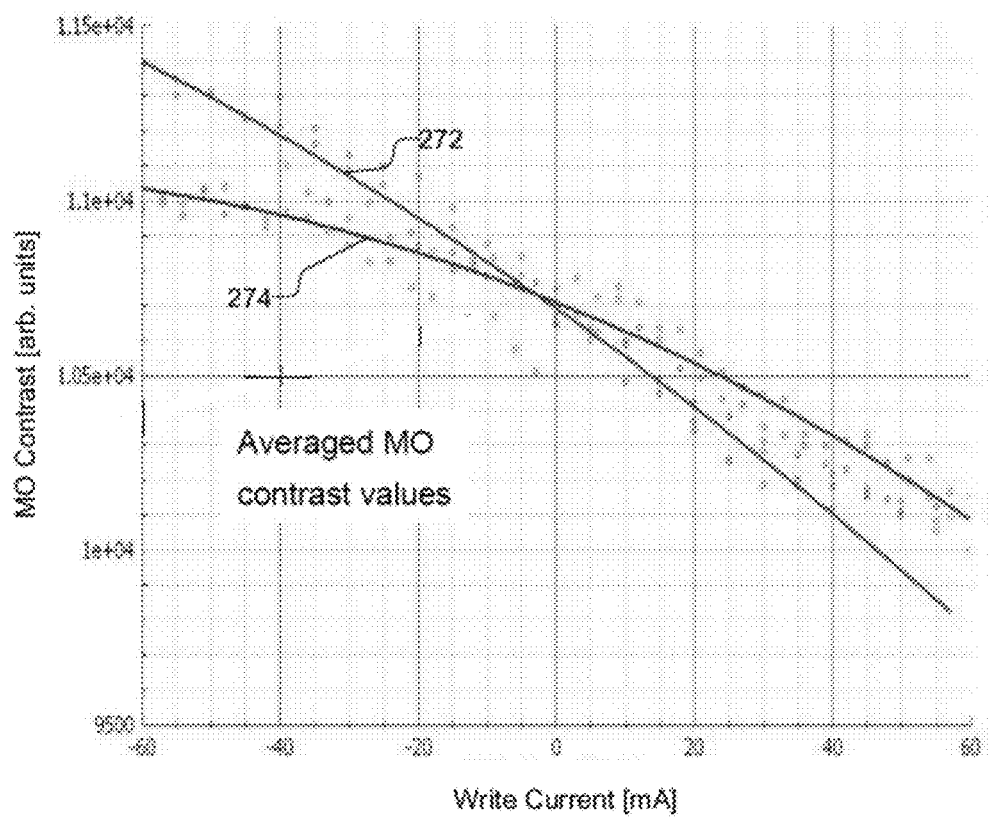
FIG. 17A illustrates a graph of saturation curves for good and bad write heads and FIG. 17B illustrates the selected area of the magneto-optic contrast image that is averaged for different values of write currents to form the saturation curve.
Figure 17B:
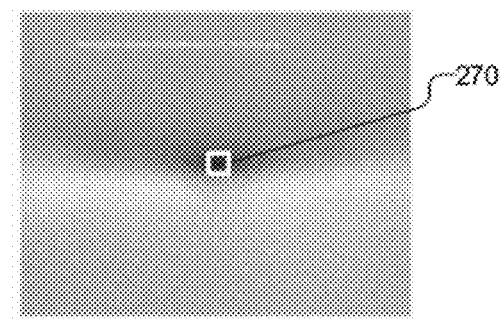

FIG. 17A illustrates a graph of saturation curves for good and bad write heads. FIG. 17A illustrates write current along the x-axis and the magneto-optic contrast along the y-axis. The magneto-optic contrast is averaged over a small selected area of the magneto-optic contrast image, e.g., equivalent to approximately the square of the pole width, as illustrated in FIG. 17B by square 270, for different values of write the write current. The graph illustrates curves for a known good write head, illustrated as curve 272, and a known bad write head, illustrated as curve 274. As can be seen, the curves 272 and 274 are easily distinguished and, therefore, by determining the average contrast for a write head over a small area of the magneto-optic contrast image (that approximately coincides with the write pole) for different write currents, a saturation curve can be generated to measure efficiency and remanence effects of the write head. Remanence is illustrated as an offset from zero in the saturation curve. Thus, one way to determine remanence is apply a write current to write head sample then to optically detect the magnetization when no write current is applied to a write head sample. For example, a positive write current may be applied, followed by optically detecting the magnetization when no write current is applied to a write head sample, then applying a negative write current, again followed by optically detecting the magnetization when no write current is applied to the write head sample. Remanence is the change in the optically detected magnetization, where no change represents no remanence. Efficiency may also be determined from the saturation curves as the ratio of the applied write current and the generated magnetic field.

In one embodiment, polarization modulation may be used by varying the polarization angle of the polarizer 108 and/or the polarizer 116, shown in FIG. 1A. The use of polarization modulation may be used advantageously to measure, e.g., remanence effects. For example, without applying a write current, the polarization angle of the polarizer 108 (or polarizer 116) is set to a certain angle, and the magnetization of the magneto-optical transducer 150 is optically detected. After setting the polarizer 108 (or polarizer 116) to a different angle the magnetization of the transducer is measured again and the resulting images are subtracted. Where remanence is present in the write head, a magneto-optic contrast will be detected. The amount of contrast may be used to quantify the remanence. Alternatively, a write current may be applied to the write head first and subsequently reduced to zero to set the write head into a possible remanent state. The above procedure may then be used to detect and measure the remanence.

In one embodiment, the magnetic field source 196 may be used to produce a biasing field or may be adjusted to produce a known magnetic field that is equal in magnitude, but opposite in polarity, to the magnetic field produced by the sample 101 at a certain location, resulting in the magneto-optic contrast being zero at that location, where zero contrast is when the measured intensity is the same as when there is no magnetic field applied to the magneto-optical transducer 150. Thus, when the contrast is zero, at a certain location the magnitude of the magnetic field produced by the sample 101 at this location is known. For example, in one embodiment, a location in the image is selected, e.g., box 270 in FIG. 17B, and the external magnetic field source 196 is adjusted to produce zero contrast at that location. In another embodiment, the external magnetic field source 196 is varied to produce zero contrast at corresponding varying locations to obtain a field magnitude contour.

Figure 18:
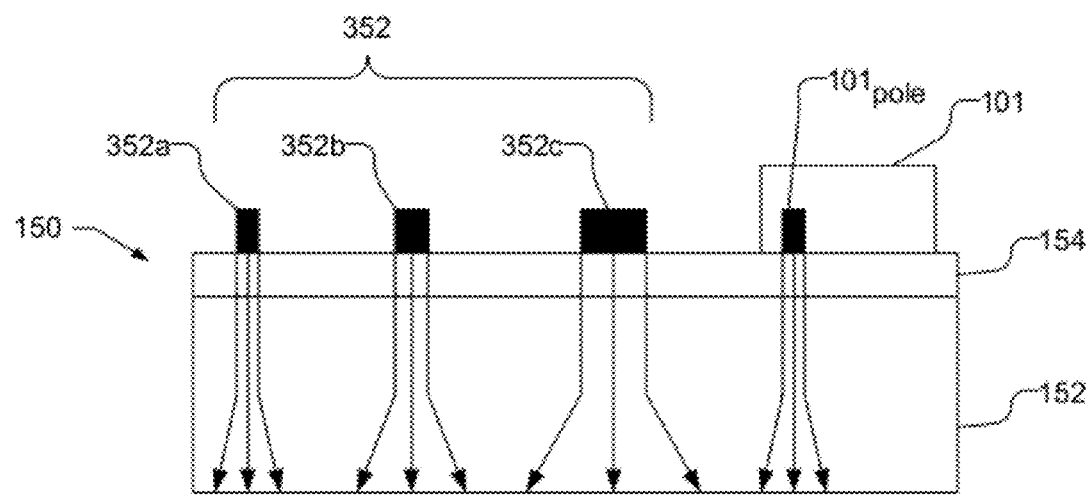
FIG. 18 is a side view of the magneto-optical transducer with reference magnetic field sources.

FIG. 18 is a side view of the magneto-optical transducer 150 with reference magnetic field sources 352a, 352b, and 352c, collectively referred to as sources 352, loaded on the magneto-optical transducer 150. The reference magnetic field sources 352 have known size and field strength parameters. During measurement of a sample 101, illustrated as a write head with a write pole $101_{pole}$, the effects of the magnetic field from the sample on the magnetization of the magnetic layer 152 may be optically detected along with the effects of the magnetic fields from reference magnetic field sources 352. The resulting magneto-optic contrasts from the sample and the reference magnetic field sources 352 can then be compared to determine desired characteristics of the sample 101. If desired, the reference magnetic field sources 352 may be fixed to the magneto-optical transducer 150 or alternatively, they may be mounted on a loader and loaded onto the magneto-optical transducer 150, e.g., in a manner similar to the sample 101 discussed above. Alternatively, the reference magnetic field sources 352 may be loaded onto the magneto-optical transducer 150 once and used as a calibration tool. Thus, the reference magnetic field sources 352 need not be loaded onto the magneto-optical transducer 150 with every sample 101.

As discussed above, the magnetic layer 152 in the magneto-optical transducer 150 need not be garnet, but may be formed from magnetic films, such NiFe, Ni, NiCr, CoFe, NiFeCr, or CoNiFe alloys or single crystals made from these elements. The magnetic layer 152 may also be a magnetic recording layer, similar to a recording storage layer on a perpendicular magnetic recording medium to be used with the write head sample 101, as discussed above. The magnetic layer 152 may also be a magnetic film similar to a SUL used on a perpendicular magnetic recording medium to be used with the write head sample 101, as discussed above. If desired, when the magnetic layer 152 is a SUL magnetic film, a magnetic recording layer may be present as well. It should be understood that magnetic films, such as Ni, NiCr, NiFe, CoFe, NiFeCr or CoNiFe, as well as magnetic recording layers and SUL, are reflective and thus, the Kerr effect is employed by the device and there is no need for the reflective layer 154.

Figure 19:
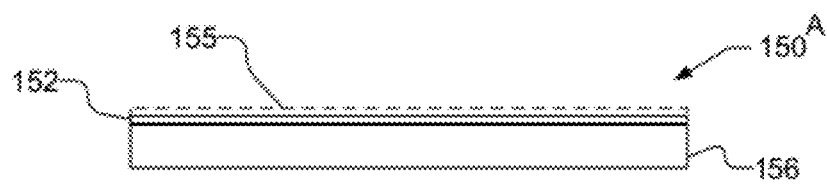
FIG. 19 illustrates a cross-sectional view of another embodiment of the magneto-optical transducer.

FIG. 19, by way of example, illustrates a magneto-optical transducer $150^4$ similar to the magneto-optical transducer 150 shown in FIG. 1B, except the magnetic layer 152 on substrate 156 is formed of a reflective magnetic film rather than a garnet film and reflective film, and thus magneto-optical transducer $150^4$ does not include a reflective layer 154. The substrate 156 may be a transparent, non-magnetic substrate such as glass, sapphire, or a non-magnetic garnet, such as Gallium-Gadolinium-garnet. As discussed above, the magnetic layer 152 may be formed of materials such as Ni, NiCr, NiFe, CoFe, NiFeCr or CoNiFe, or a magnetic recording layer (such as magnetic recording layer 162 discussed in reference to FIG. 4C) or a SUL magnetic film (such as SUL magnetic film 160 discussed in reference to FIG. 4B), or any other similarly magnetic reflective films, which may be magnetically "soft", i.e., which can be magnetized but do not stay magnetized, or magnetically "hard", which stay magnetized. The magnetic layer 152 may be deposited on the substrate 156 using conventional techniques and materials used in the disk drive industry. By way of example, when the magnetic layer 152 is a magnetic recording layer, the magnetic layer 152 may be a Cobalt alloy or an iron alloy that is sputter deposited on the substrate 156 to, e.g., 15 nm thick. When the magnetic layer 152 is a SUL magnetic film, the magnetic layer 152 may be, e.g., a sputter deposited Cobalt alloy, such as CoTaZr, or an Iron alloy. As is well known in the art, both Cobalt and Iron alloys can be either be magnetically "hard" or "soft" depending on composition, sputter condition, seed layer etc. For example, hard compositions include CoCr, CoPtCr, FePt (HAMR medium), while soft compositions include CoNiFe, NiFe, CoZrFe. If desired, other materials and thicknesses may be used for the magnetic layer 152 and additional layers may be present. For example, when the magnetic layer 152 is a magnetically "soft" material, such as a SUL magnetic film, a magnetically "hard" material, such as magnetic recording layer 155 may be present, as illustrated with broken lines in FIG. 19. When the magnetic layer 152 is magnetically "soft" and is covered with a magnetically "hard" material, such as a magnetic recording layer 155, the magneto-optical transducer $150^4$ is functionally magnetically "hard" as the magnetic layer 152 will stay magnetized due to the presence of the magnetically "hard" layer 155. Additionally, seed layers or a separation layer between the SUL magnetic layer 152 and the magnetic recording layer 155 may be used. For example, the magnetic layer 152 may be part of a full medium stack used in conventional magnetic media. Thus, there may be a layer below the magnetic layer 152, e.g., between the substrate 156 and the magnetic layer 152, which is sufficiently thin as to be transparent, may be produced from a material that is transparent to the wavelengths of illumination used, or may be a "soft" magnetic material, and thus, the seed layer becomes essentially the magnetic layer. Further, if desired, a reflective layer 154 and/or a protective layer 158, as illustrated in FIG. 1B, may be included (not shown in FIG. 19).

One advantage of using a reflective magnetic film as the magnetic layer 152 instead of using a garnet film is that the detection of small parasitic fields emanating from areas of the write head other than the write pole, e.g. shield domains, is suppressed, particularly when the magneto-optical transducer $150^4$ is magnetically "hard." Additionally, the metrology system may use write current waveforms with adjustable pulse parameters such as overshoot and rise-time, which are used in the actual recording process.

The magneto-optical transducer $150^4$ may be used in a metrology device 100 such as that shown in FIG. 1A. In use, the write head sample 101 is brought near or in contact with the magnetic layer 152 of the magneto-optical transducer $150^4$ and the write head is energized with a positive or negative write current by probe card 140 to produce a magnetization reversal in the magnetic layer 152. As discussed above, the probe card 140 may also control the DFH (if used) and apply bias to the write head sample as discussed above. The back side of the magnetic layer 152, i.e., the side opposite to the write head sample 101, is illuminated through the substrate 156 with linearly polarized light over an area that is at a same position as a write pole $101_{pole}$ of the write head sample 101. If desired, the back side of the magnetic layer 152 may be illuminated while the write head sample 101 is held near or in contact or at a later time, e.g., the magnetization of the magnetic layer 152 may be produced and measured at a later time while the write head sample 101 is no long in contact or near the magnetic layer 152, when the magneto-optical transducer $150^4$ is magnetically "hard." The polarization rotation of the reflected light caused by the interaction of the polarized light with the magnetic layer magnetization (Kerr effect) is analyzed by means of polarizer 116, which is sometimes referred to as an analyzer and quarter waveplate 116a. The switching of the magnetic recording structure induced by the write field from the write head sample 101 is detected and analyzed. If desired, different magnitudes of write current may be used. For example, measurements may be made at multiple write current levels, such as 20 mA to 100 mA in 5 mA increments, to detect a saturation response.

The objective lens 114 is focused on the magnetic layer 152, as opposed to the write head sample 101 itself. The magnetic layer 152 has a fixed position and the write head sample 101 is held in contact or near the magnetic layer 152. Accordingly, focusing is faster than if focusing were on the write head sample 101 itself, because the position of the magnetic layer 152 will be relatively unchanged independent of head being tested, or irregularities in bowing of the device-under-test (e.g., in case of bar), irregularities in the holder, or irregularities in the bar positioning stage.

Figures 20, 21:
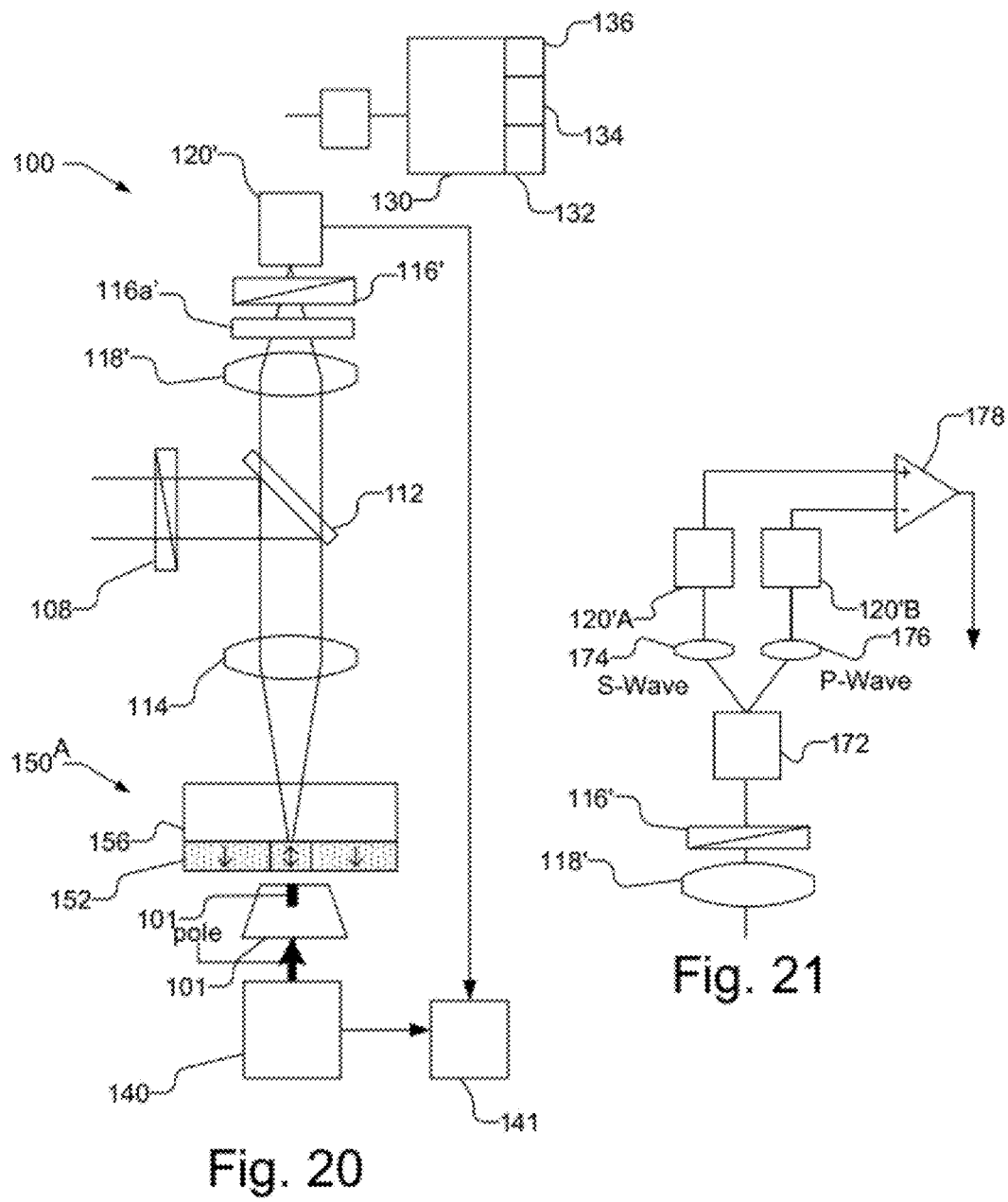
FIG. 20 illustrates a portion of the metrology device in which focused beam illumination is used, either with a focal area of similar size or larger than the diameter of the write pole.
FIG. 21 illustrates the use of multiple photo-detectors as the optical detector.

The illumination used with the magneto-optical transducer $150^4$ may be focused beam illumination with a focal area of similar diameter as the diameter of the write pole $101_{pole}$ (e.g., 300 nm); focused beam illumination with a focal area that is significantly larger than the area of the write pole $101_{pole}$ (e.g., 3 micron); or wide-field illumination. FIG. 20 illustrates a portion of the metrology device 100 in which focused beam illumination is used, either with a focal area of similar size or larger than the diameter of the write pole. As illustrated in FIG. 20, the polarizer 108 polarizes the incident light, which may be produced by a blue laser, e.g., having a wavelength between 400 nm to 475 nm and more specifically, 445 nm at 1.2 W. A beam splitter 112 directs a portion of the light to magneto-optical transducer $150^4$ via objective lens 114 and passes returning light to optical detector 120' via lens 118' and polarizer 116' and quarter waveplate 116a', which are illustrated in reverse order compared to polarizer 116 and quarter waveplate 116a with respect to the lens 118 in FIG. 1. When the focal area of the illumination is of similar diameter as the diameter of the write pole, the metrology device 100 functions as a scanning beam microscope or a scanning confocal microscope and the reflected and polarization analyzed light is detected using an optical detector 120' that is a photo-detector, such as a photodiode, which detects the optical intensity at a single spot. By applying a periodic write-current-waveform, a lock-in amplifier 141 can be used to detect the photo-detector signal from detector 120 using the write current clock signal from probe card 140 as a reference. The repetition rate can be e.g., 1 kHz to 10 MHz. When the focal area of the illumination is a focal area that is significantly larger than the area of the write pole, the metrology device 100 shown in FIG. 20 functions as a scanning beam or non-scanning microscope or a confocal microscope and the reflected and polarization analyzed light is again detected using a photo-detector with or without lock-in detection.

When using a photo detector 120' as illustrated in FIG. 20, a magneto-optic Kerr signal may be generated by the surface magnetization of the write pole $101_{pole}$ in the write head sample 101, which is in close contact with the surface of the magnetic layer 152, because the magnetic layer 152 may have a thickness of approximately 15 nm and is semi-transparent at the wavelength of the illuminating beam (270 nm to 670 nm). For both a magnetically "hard" and "soft" magneto-optical transducer $150^4$, the magnetic layer 152 may be magnetized by applying a write current. An advantage of using magnetically "hard" material for the magneto-optical transducer $150^4$ is the ability to suppress the contribution of the write-pole signal by using a very short write current pulse width, e.g., approximately 2 ns, which may be applied to reverse the magnetization in the magnetic layer 152. Thus, the write current waveform has a small duty cycle at a kHz or MHz repetition rate and consequently there is a negligible contribution of the Kerr signal from the write pole. Alternatively, to suppress the contribution of the write-pole signal, the thickness of the magnetic layer 152 may be greater than 15 nm, a different type of material may be used for the magnetic layer 152, an object lens 114 with a focus that is less than, or not sensitive at, this depth may be used, or different wavelengths of light may be used. Additionally, if desired, the DFH activation may be synchronized, such that a measurement may be made while the write current is on, but the DFH is off, although the DFH was on during the prior medium write. In other words, DFH is cycled within the write current cycling. The DFH may be on all the time or only during the write current excitation. DFH may also be cycled on and off while the write current is on.

Further, the DFH feature of the write head sample 101 may be engaged during measurement, which is advantageous as the DFH can cause significant artifacts due to heating when the magnetic layer 152 is a soft-magnetic layer. Additionally, the technique may be used with a Heat Assisted Magnetic Recording (HAMR) write head that includes an internal or external laser heating source. For a HAMR write head, the probe card and a bias source is used to probe and bias the laser source of the HAMR head (in case the head has a laser source). In case the HAMR head is without the laser, an external laser system is used. Additionally, the technique may be used with a Microwave Assisted Magnetic Recording (MAMR) write head.

As illustrated in FIG. 21, if desired, rather than using a single photo-detector 120' as shown in FIG. 20, the reflected light can be split in its vertical and horizontal polarization components using a Wollaston prism 172 that separates the S and P polarization components of the light, which may be received by non-imaging detectors, such as photo-detectors 120'A and 120'B, via lenses 174 and 176, respectively. If desired, the photo-detectors 120'A and 120'B may be coupled to a differential amplifier 178, which is coupled to the lock-in amplifier 141, shown in FIG. 20. By rotating the Wollaston prism 172 with respect to the polarization plane the output of the amplifier 178 may be zeroed for the case that the net magnetization of the recording medium is zero.

Figure 22:
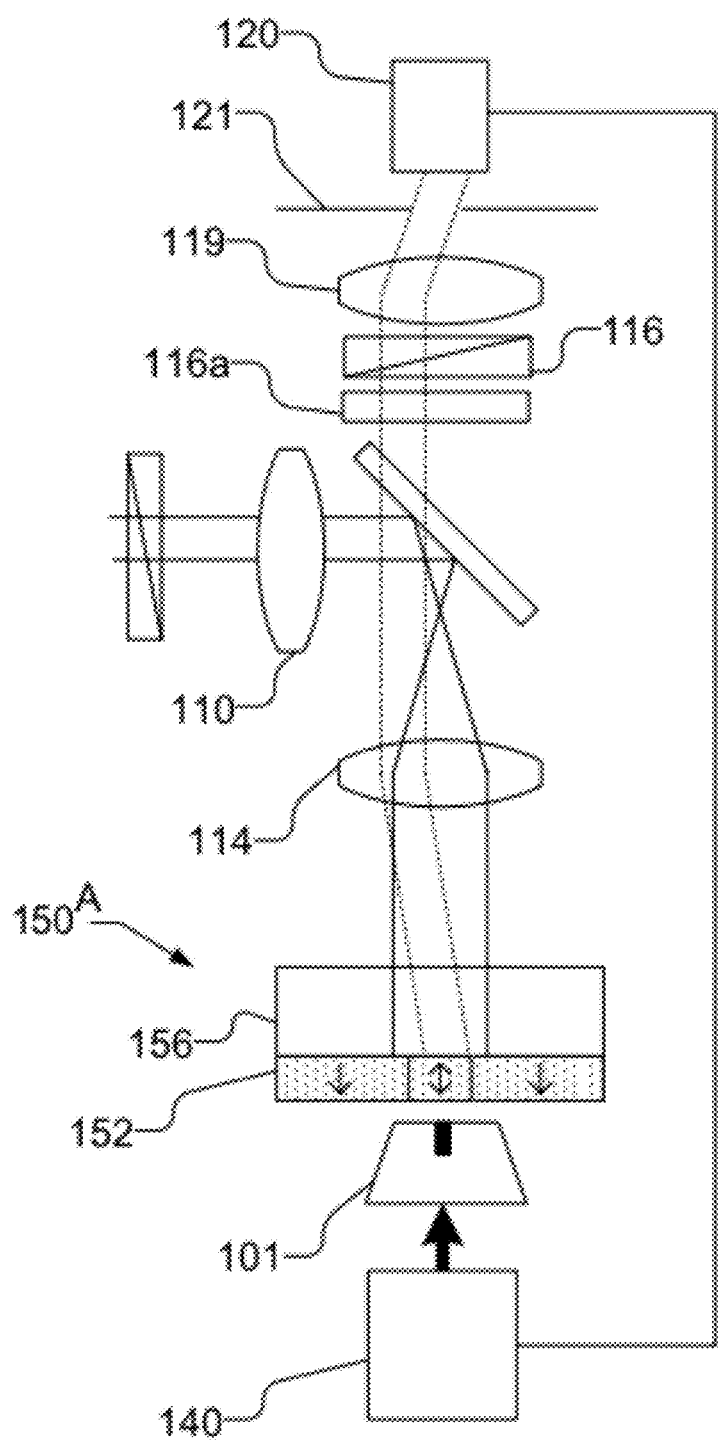
FIG. 22 illustrates a portion of the metrology device in which wide-field illumination is used.

FIG. 22 illustrates a portion of the metrology device 100 in which wide-field illumination is used. The metrology device 100 illustrated in FIG. 22 is similar to that shown in FIG. 20, like designated elements being the same, except that the optical detector 120 is a, e.g., a CCD or a CMOS based camera, or other appropriate imaging device, and may be a high resolution CMOS camera with 1920×1440 pixels and 12 bit A/D converter, such as produced by Hamamatsu Co. The polarizer 116 and quarter waveplate 116a are illustrated in reverse order with respect to the lens 118 compared to FIG. 20. Additionally, as illustrated in FIG. 22, a lens 110 may be present between polarizer 108 and beam splitter 112, which may not be present in the configuration illustrated in FIG. 20. In addition, as discussed above, it may be desirable to reduce or eliminate the coherence of the laser light to avoid speckles and diffraction artifacts in the image. The coherence of the laser light can be reduced by one or more of the following; vibrating an optical fiber through which the light is transmitted, modulating the laser at a frequency of e.g. 250 MHz, using a dynamic mirror with an oscillating membrane, or by inserting an optical diffuser in the illuminating light path. In a different approach, a multimode laser diode can be used to reduce light coherence with or without the previous measures implemented.

Figure 23:
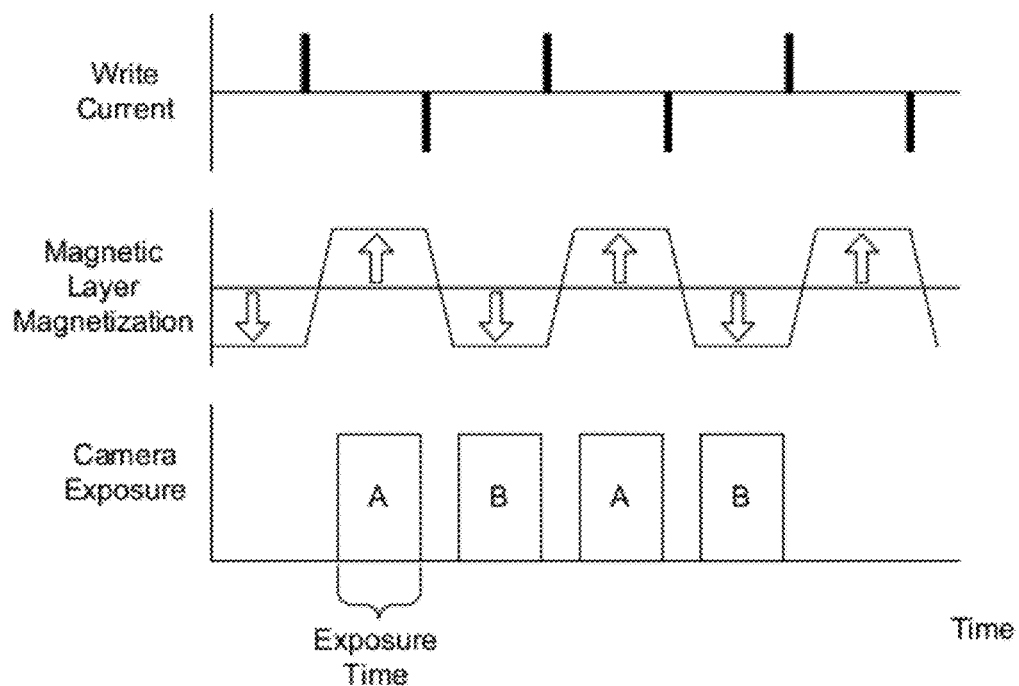
FIG. 23 illustrates aligned graphs of the write current, magnetization of the recording medium in the magneto-optical transducer, and the camera exposure with respect to time, in which pulsed write currents are used.

With wide-field illumination, the optical detector 120 is used to create an image of the pole area, where the area of the image is determined by an aperture 121 in the imaging path. The camera frame acquisition may be synchronized with the write current and image frames may be acquired during or after the application of the write currents, which may be negative or positive. Image frames taken after positive and negative currents respectively may be subtracted to produce a difference image. For example, FIG. 23 illustrates aligned graphs of the write current, magnetization of the magnetic layer 152 in the magneto-optical transducer $150^4$, and the camera exposure with respect to time. As illustrated, the camera exposure A is synchronized to be produced after a positive write current and exposure B is synchronized to be produced after a negative write current. A difference image may be produced as a difference between exposure A with exposure B. Because the magnetization of the magnetic layer 152 in the magneto-optical transducer $150^A$ under the write pole is continuously cycled between the up and down directions while the write head sample 101 remains in contact with the medium in the same location, there is no need to DC erase the medium before performing the measurement.

Figure 24:
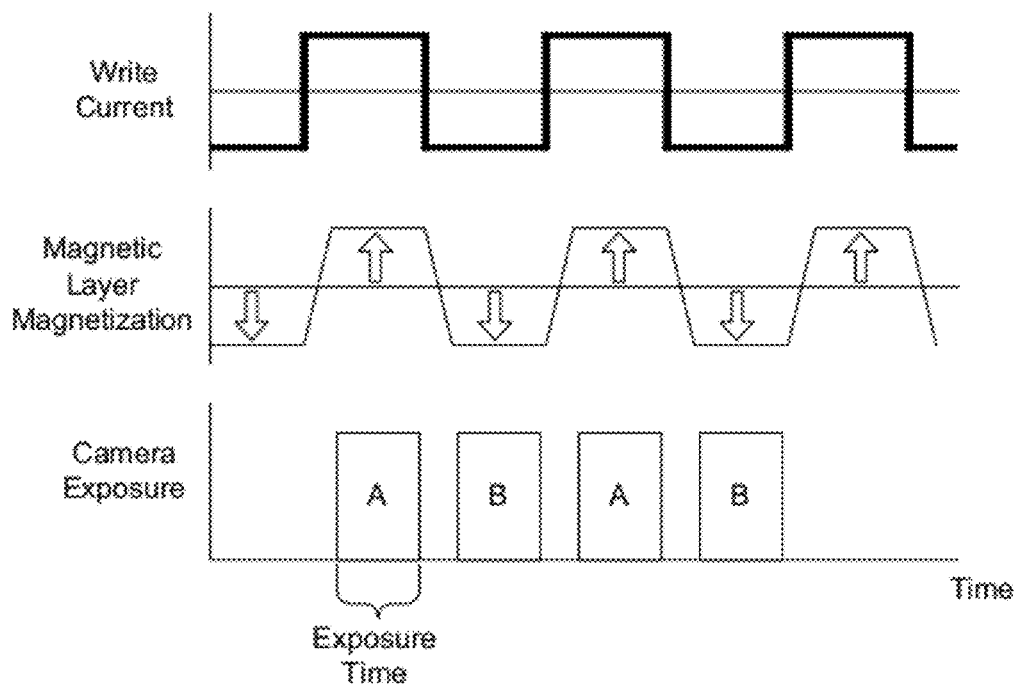
FIG. 24 illustrates aligned graphs of the write current, magnetization of the recording medium in the magneto-optical transducer, and the camera exposure with respect to time, in which a square wave write current is used.

If the contribution of the Kerr signal generated by the write pole $101_{pole}$ is small, e.g. 1% of the signal from the magnetic layer 152, a continuous write current excitation, such as a sine wave or a square wave, may be used in all cases, i.e. the Kerr signal is measured while the write current is on. For example, the write current sequence in FIG. 23 may be replaced by a square-wave or a sine-wave. Images are captured, or the Kerr signal may be measured without images, while the write current is on as illustrated in FIG. 24. If desired, the write current may have a 50% duty cycle, as illustrated in FIG. 24, but if desired, other duty cycles may be used. The use of a continuous write current sequence, as illustrated in FIG. 24, is also advantageous when the magneto-optical transducer $150^A$ is formed from a magnetically "soft" magnetic layer 152, such as a SUL magnetic film (without an overlying magnetic recording layer 155), in which the magnetization is not stored.

In another approach, one or more bits (e.g., magnetized areas on the magnetic layer 152) may be written on the magnetic layer 152 by bringing the write head sample 101 in close contact with the magnetic layer 152. When the magneto-optical transducer $150^A$ is magnetically "hard," prior to writing the bit or bit pattern, the magnetic layer 152 is DC erased, i.e. the magnetic layer 152 magnetization is set in a well-defined direction, and a Kerr image is generated as an average over many image frames, e.g. 106 image frames, and the image is stored as a reference image. The bit or bit pattern is then written without DC erasing of the medium between writing bits in the case of the bit pattern. A second Kerr image is then generated, e.g., again as an average over many image frames, e.g. 106 image frames, and the image is stored. The first Kerr image (reference image) is subtracted from the second Kerr image to render a difference image that reveals information on the reversed magnetization of the medium caused by the write process. The difference image may be calculated in the metrology device 100 immediately or off-line later.

The bit or bit pattern can also be imaged without using a reference Kerr image of the DC erased magnetic layer 152. For example, after writing the bit, or bit pattern, a first image is captured with the polarizer 116 setting of, e.g. −15° and a second image is captured with the polarizer 116 setting of, e.g. +15°. The first image and second image may then be subtracted to reveal information on the reversed magnetization of the medium caused by the write process.

In another approach, rather than using a wide-field Kerr microscope (such as that illustrated in FIG. 22), a focused beam or confocal microscope (such as that illustrated in FIG. 20) may be used to image the written bit or bit pattern after the bits have been completed. The illuminating spot may be focused to a spot of, e.g. 300 nm, that is scanned over an area that contains the written bit or bits while the polarizer 116 setting or the polarization of the illuminating laser beam is modulated. The reflected light is detected by the photo-detector 120' and the lock-in amplifier 141 that uses the polarization modulation clock as a reference to measure the photo-detector signal. The detected signal originating from the area of the written bit will have a 180° phase shift relative to the signal derived from the surrounding area, i.e. the DC erased medium.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method of characterizing performance of a write head using an optical metrology device, the method comprising:
    holding the write head in contact with or near a magnetic layer on a substrate that is transparent and non-magnetic;
    illuminating an area of the magnetic layer through the substrate with linearly polarized light, the area of the magnetic layer being under a write pole of the write head;
    producing magnetization in the write pole to alter the magnetization of the magnetic layer, the magnetization of the magnetic layer producing an altered polarization state in light reflected from the magnetic layer;
    analyzing the light reflected from the magnetic layer;
    detecting an intensity of the light reflected from the magnetic layer after being analyzed;
    using the intensity to characterize the performance of the write head; and
    storing the performance in memory.

2. The method of claim 1, wherein the magnetic layer comprises a magnetic recording layer.

3. The method of claim 1, wherein the magnetic layer comprises a soft-under-layer.

4. The method of claim 1, wherein the magnetic layer comprises a garnet film.

5. The method of claim 1, wherein the magnetic layer comprises a magnetic film selected from the group comprising NiFe, Ni, NiCr, CoFe, NiFeCr, and CoNiFe.

6. The method of claim 1, wherein producing magnetization in the write pole is performed while illuminating the area of the magnetic layer through the substrate.

7. The method of claim 1, wherein producing magnetization in the write pole is performed before illuminating the area of the magnetic layer through the substrate.

8. The method of claim 1, wherein holding the write head in contact and producing magnetization in the write pole are performed at a different time than illuminating the area of the magnetic layer, analyzing the light, detecting the intensity, using the intensity and storing the performance.

9. The method of claim 1, wherein illuminating the area of the magnetic layer comprises producing focused beam illumination on the area, wherein the area has a diameter that is approximately equal to or larger than a diameter of the write pole.

10. The method of claim 1, wherein illuminating the area of the magnetic layer comprises producing wide-field illumination.

11. The method of claim 1, wherein illuminating the area of the magnetic layer comprises producing illumination that is scanned over the area of the magnetic layer.

12. The method of claim 1, wherein detecting the intensity of the light uses at least one photo-detector.

13. The method of claim 12, wherein detecting the intensity of the light comprises separating polarization components of the light reflected from the magnetic layer after being analyzed and using two photo-detectors to detect the intensity of the polarization components.

14. The method of claim 12, wherein producing magnetization in the write pole comprises applying a periodic write current waveform using a write current clock signal, and wherein detecting the intensity of the light comprises using a lock-in amplifier and the write current clock signal as a reference.

15. The method of claim 14, wherein the periodic write-current-waveform has a 50% duty cycle.

16. The method of claim 1, wherein detecting the intensity of the light comprises using a camera to produce an image of the area.

17. The method of claim 16, wherein using the camera to produce the image of the area comprises synchronizing image frame acquisition with application of write currents and wherein image frames are acquired after the application of negative write currents and positive write currents.

18. The method of claim 17, wherein positive image frames taken after the positive write currents and negative image frames taken after the negative write currents, and the positive image frames and the negative image frames are subtracted to produce the image of the area.

19. The method of claim 17, wherein the write currents are pulsed.

20. The method of claim 16, further comprising storing the image in memory.

21. The method of claim 1, wherein the performance of the write head comprises the performance of a Dynamic Flying Height element on the write head.

22. The method of claim 1, wherein magnetization in the write pole is produced by applying current to the write head from one of a probe card, pogopins, and a connector, coupled to a programmable bias source.

23. The method of claim 22, wherein the programmable bias source can change the polarity of the current.

24. The method of claim 1, wherein the write head is one of a bar, slider, head gimbal assembly or head stack assembly.

25. The method of claim 1, wherein the write head is an energy-assisted magnetic recording head.

26. The method of claim 25, wherein the energy-assisted magnetic recording head comprises one of a Heat Assisted Magnetic Recording (HAMR) write head and a Microwave-Assisted magnetic recording (MAMR) head.

27. An apparatus for testing a write head sample, the apparatus comprising:
a magneto-optical transducer comprising a magnetic layer on a substrate that is transparent and non-magnetic, the magnetic layer having a magnetization produced by magnetizing the write head sample when the write head sample is in contact or near the magnetic layer;
a light source for producing light along an optical path;
a polarizer on the optical path that produces polarized light;
an optical system on the optical path that illuminates the magnetic layer with the polarized light through the substrate, wherein the magnetization of the magnetic layer produces an altered polarization state in reflected light from the magnetic layer;
an analyzer on the optical path that converts the altered polarization state in the reflected light to an intensity;
an optical detector on the optical path that detects the intensity of the reflected light; and
a processor coupled to the optical detector to receive the intensity, the processor configured to determine a performance characteristic of the write head sample using the intensity and store the performance characteristic in memory.

28. The apparatus of claim 27, wherein the magnetic layer comprises a magnetic recording layer.

29. The apparatus of claim 27, wherein the magnetic layer comprises a soft-under-layer.

30. The apparatus of claim 27, wherein the magnetic layer comprises a garnet film.

31. The apparatus of claim 27, wherein the magnetic layer comprises a magnetic film selected from the group comprising NiFe, Ni, NiCr, CoFe, NiFeCr, and CoNiFe.

32. The apparatus of claim 27, wherein the magnetic layer is illuminated with the polarized light while the write head sample is not in contact or near the magnetic layer.

33. The apparatus of claim 27, wherein the magnetic layer is illuminated with the polarized light while the write head sample is in contact or near the magnetic layer.

34. The apparatus of claim 33, further comprising a probe configured to be coupled to the write head sample to provide a current to produce the magnetization in the write head sample, wherein the magnetization in the write head sample is produced while illuminating the magnetic layer.

35. The apparatus of claim 34, further comprising a lock-in amplifier coupled to the probe to receive a write current clock signal as a reference and coupled to receive the intensity detected by the optical detector.

36. The apparatus of claim 33, further comprising a probe configured to be coupled to the write head sample to provide a current to produce the magnetization in the write head sample, wherein the magnetization in the write head sample is produced before illuminating the magnetic layer.

37. The apparatus of claim 27, wherein the optical system is configured to produce focused beam illumination on an area of the magnetic layer with a diameter that is approximately equal to or larger than a diameter of a write pole of the write head sample.

38. The apparatus of claim 27, wherein the optical system is configured to produce wide-field illumination on the magnetic layer.

39. The apparatus of claim 27, wherein the optical system is configured to scan the polarized light over the magnetic layer.

40. The apparatus of claim 27, wherein the optical detector comprises at least one photo-detector.

41. The apparatus of claim 27, further comprising a Wollaston prism that separates the polarization components of the reflected light and the optical detector comprises two photo-detectors to detect the intensity of the polarization components.

42. The apparatus of claim 27, wherein the optical detector comprises a camera.

43. The apparatus of claim 42, further comprising a probe configured to be coupled to the write head sample to provide a write current to the write head sample to produce the magnetization in the write head sample, wherein the camera is configured to synchronize image frame acquisition with application of the write currents and wherein image frames are acquired after the application of negative write currents and positive write currents.

44. The apparatus of claim 43, wherein positive image frames taken after the positive write currents and negative image frames taken after the negative write currents, and wherein the processor is configured to subtract the positive image frames and the negative image frames to produce the image of the magnetic layer.

45. The apparatus of claim 43, wherein the write currents are pulsed.

46. The apparatus of claim 42, wherein processor is further configured to store an image captured by the camera in memory.

47. The apparatus of claim 27, wherein the performance of the write head sample comprises the performance of a Dynamic Flying Height element on the write head.

48. The apparatus of claim 27, further comprising a probe configured to be coupled to the write head sample to provide a write current to the write head sample, the probe comprising one of a probe card, pogopins, and a connector, coupled to a programmable bias source.

49. The apparatus of claim 48, wherein the programmable bias source can change the polarity of the current.

50. The apparatus of claim 27, wherein the write head sample is one of a bar, slider, head gimbal assembly or head stack assembly.

51. The apparatus of claim 27, wherein the write head sample is an energy-assisted magnetic recording head.

52. The apparatus of claim 51, wherein the energy-assisted magnetic recording head comprises one of a Heat Assisted Magnetic Recording (HAMR) write head and a Microwave-Assisted magnetic recording (MAMR) head.

\* \* \* \* \*